(12) United States Patent
Shiratori

(10) Patent No.: US 8,686,448 B2
(45) Date of Patent: Apr. 1, 2014

(54) LIGHT EMITTING DEVICE, ELECTRONIC APPARATUS, AND MANUFACTURING METHOD OF LIGHT EMITTING DEVICE

(75) Inventor: Koya Shiratori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 102 days.

(21) Appl. No.: 13/478,929

(22) Filed: May 23, 2012

(65) Prior Publication Data

US 2012/0299031 A1 Nov. 29, 2012

(30) Foreign Application Priority Data

May 27, 2011 (JP) ................................. 2011-119675
Jun. 1, 2011 (JP) ................................. 2011-123401

(51) Int. Cl.
*H01L 29/20* (2006.01)
(52) U.S. Cl.
USPC ........................ 257/89; 257/79; 257/E33.001

(58) Field of Classification Search
USPC ...................................... 257/79, 89, E33.001
See application file for complete search history.

(56) References Cited

PUBLICATIONS

Lee, Sunghun et al., "P-146: Highly Efficient Top Emitting White OLED Architecture for Micro-display Applications," SID 10 Digest, 2010, pp. 1796-1799.

*Primary Examiner* — Anthony Ho
(74) *Attorney, Agent, or Firm* — Oliff PLC

(57) ABSTRACT

$D=\{(2\pi m+\phi_L+\phi_U)/4\pi\}\lambda$ is satisfied when an optical path length between a reflecting layer and pixel electrode and a counter electrode is D, a phase shift in reflection in the reflecting layer and pixel electrode is $\phi_L$, a phase shift in reflection in the counter electrode is $\phi_U$, a peak wavelength of a standing wave generated between the reflecting layer and pixel electrode, and the counter electrode is $\lambda$, and an integer of 2 or less is m. Here, among red, green, and blue pixel reflecting layer and pixel electrode, at least one reflecting layer and pixel electrode may be made of a different metal material from that of the other reflecting layer and pixel electrodes.

20 Claims, 22 Drawing Sheets

FIG. 10

|  | ORGANIC LAYER FILM THICKNESS | REFLECTING LAYER | | |
| --- | --- | --- | --- | --- |
|  |  | R PIXEL | G PIXEL | B PIXEL |
| COMPARATIVE EXAMPLE 1 | 100 nm | Al | Al | Al |
| EXAMPLE 1 | 100 nm | Au | Al | Al |
| EXAMPLE 2 | 100 nm | Cu | Al | Al |
| EXAMPLE 3 | 100 nm | Ag | Al | Al |

FIG. 11

|  | POWER CONSUMPTION | COLOR RANGE [%] |
| --- | --- | --- |
| COMPARATIVE EXAMPLE 1 | 1.00 | 75.14 |
| EXAMPLE 1 | 0.80 | 76.42 |
| EXAMPLE 2 | 0.82 | 76.28 |
| EXAMPLE 3 | 0.85 | 75.69 |

FIG. 14

|  | ORGANIC LAYER FILM THICKNESS | REFLECTING LAYER | | |
| --- | --- | --- | --- | --- |
|  |  | R PIXEL | G PIXEL | B PIXEL |
| COMPARATIVE EXAMPLE 2 | 90 nm | Al | Al | Al |
| EXAMPLE 4 | 90 nm | Au | Al | Al |
| EXAMPLE 5 | 90 nm | Cu | Al | Al |
| EXAMPLE 6 | 90 nm | Ag | Al | Al |

FIG. 15

|  | POWER CONSUMPTION | COLOR RANGE [%] |
| --- | --- | --- |
| COMPARATIVE EXAMPLE 2 | 0.99 | 74.36 |
| EXAMPLE 4 | 0.66 | 75.98 |
| EXAMPLE 5 | 0.68 | 75.72 |
| EXAMPLE 6 | 0.75 | 75.19 |

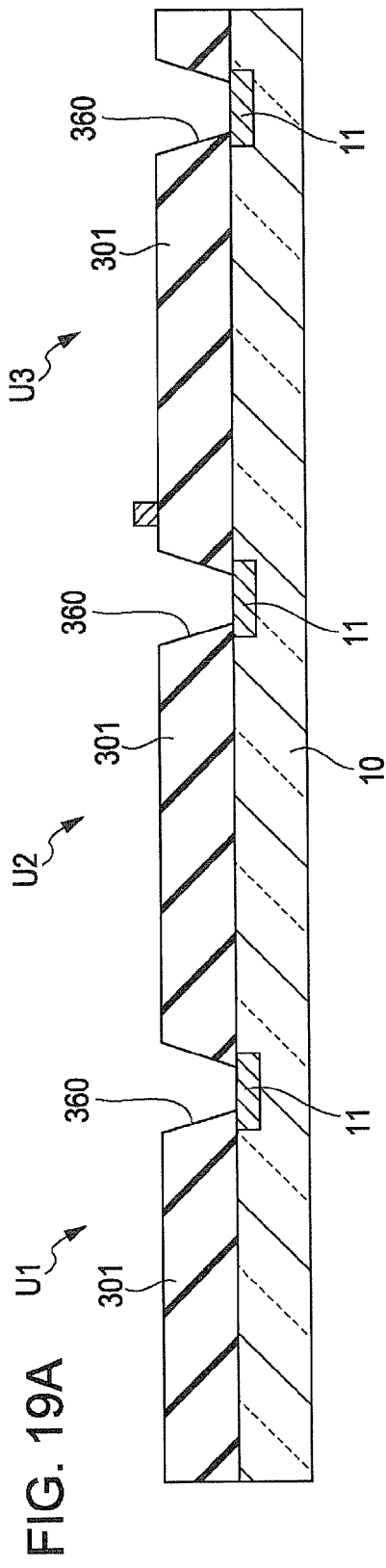
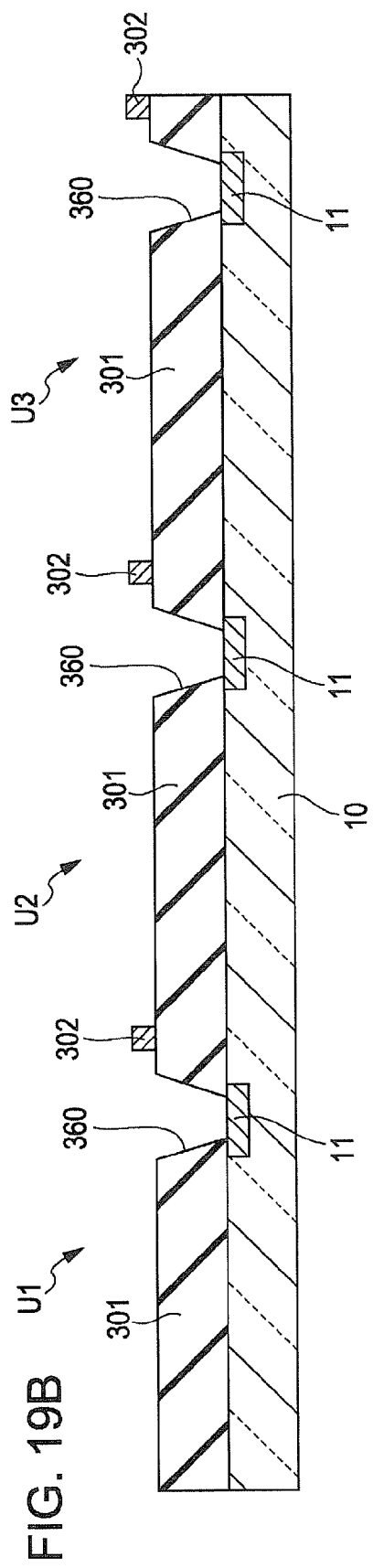

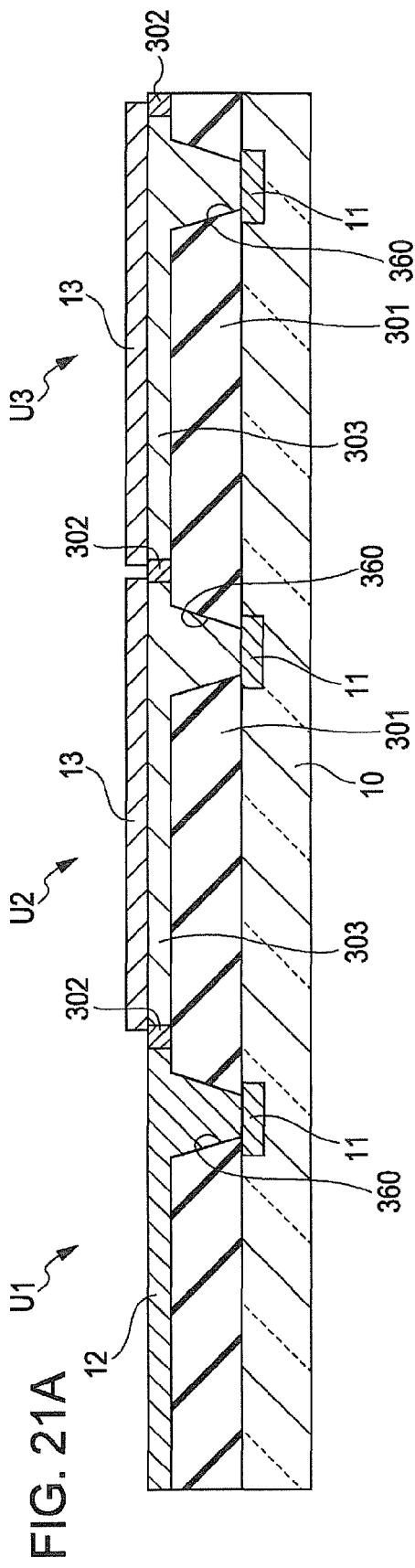
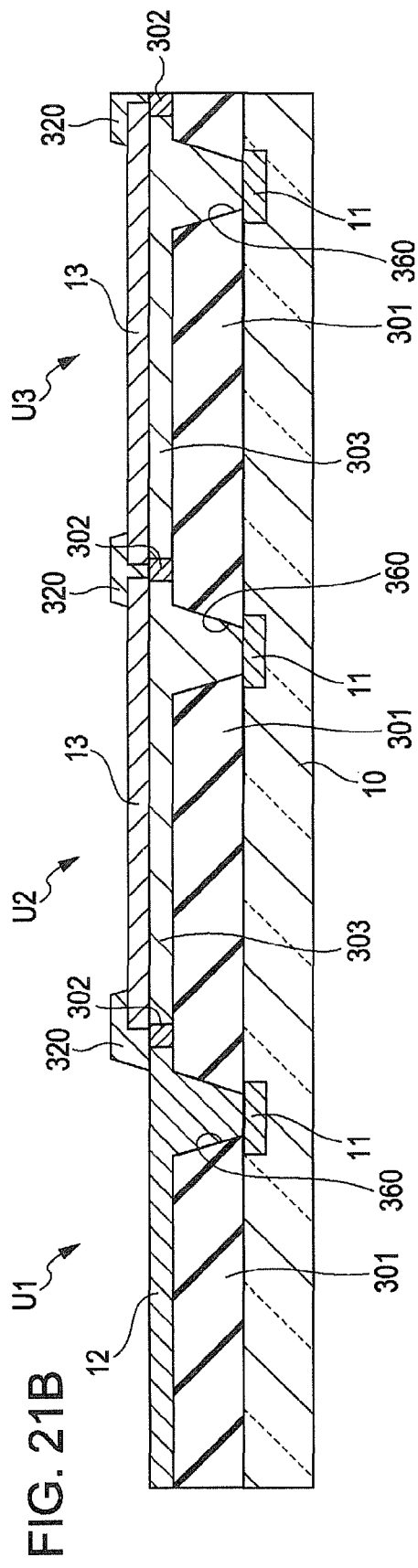
FIG. 21A
FIG. 21B

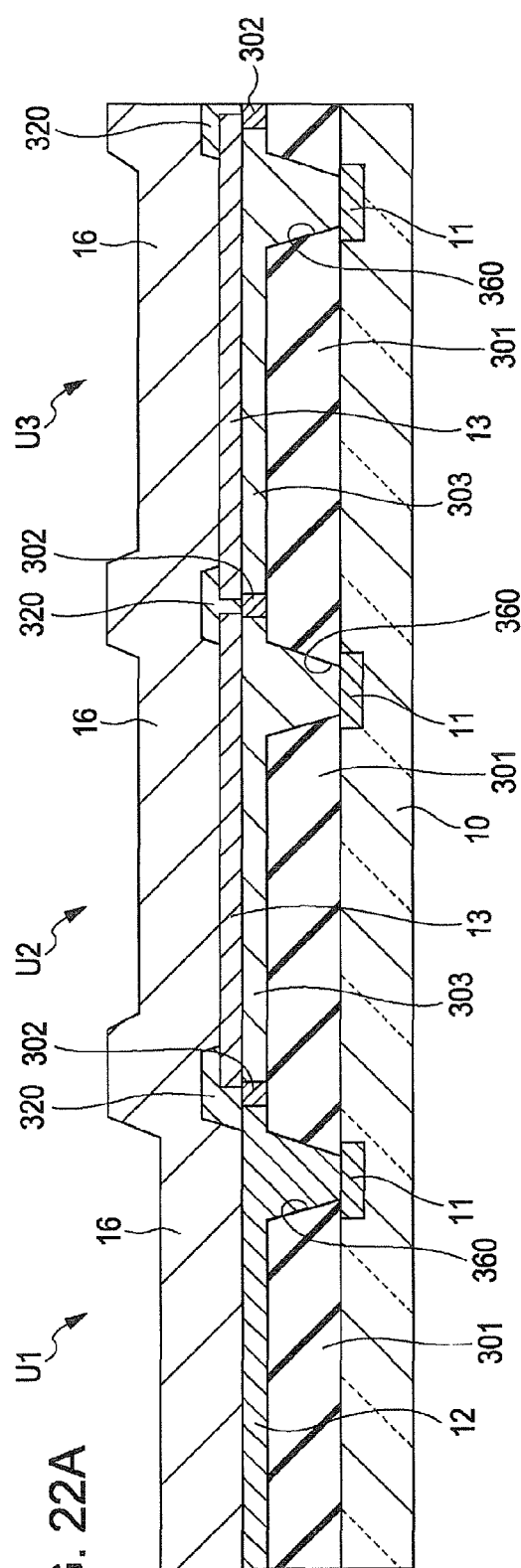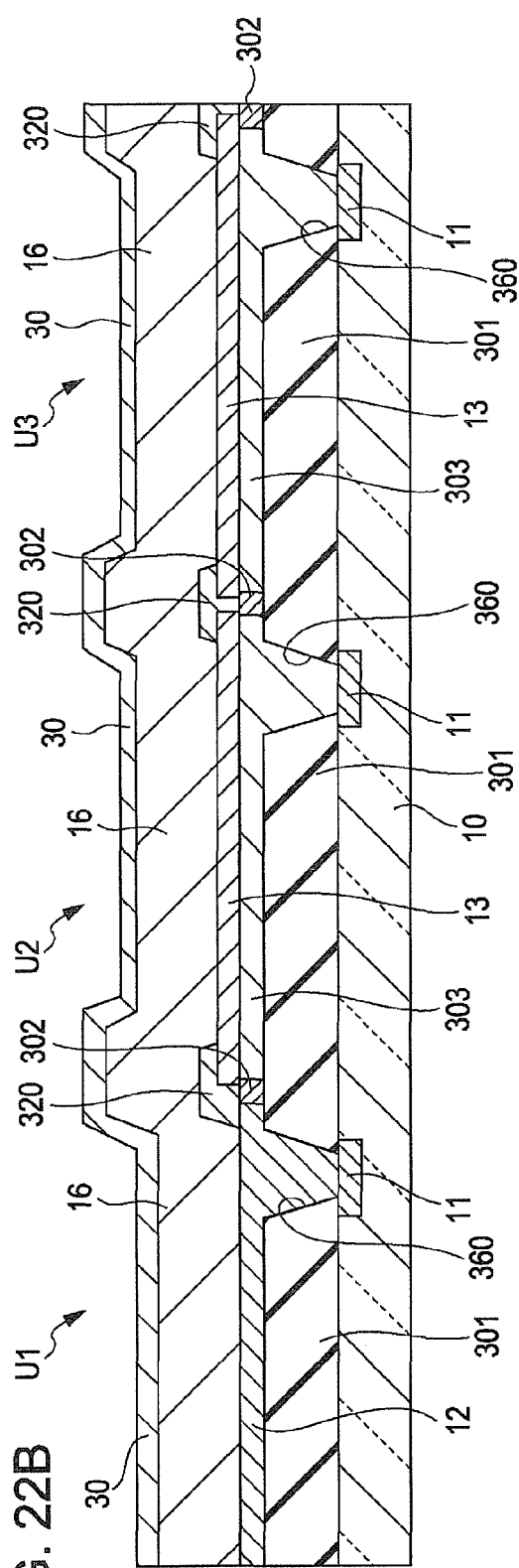

LIGHT EMITTING DEVICE, ELECTRONIC APPARATUS, AND MANUFACTURING METHOD OF LIGHT EMITTING DEVICE

BACKGROUND

1. Technical Field

The present invention relates to a light emitting device that uses a variety of light emitting elements, an electronic apparatus including the light emitting device, and a manufacturing method of the light emitting device.

2. Related Art

In recent years, a top emission method light emitting device in which an organic EL (electro luminescence) element as a light emitting element is formed on a substrate, and the emitted light of the light emitting element is extracted to the opposite side of the substrate has been frequently used as a display device, and the like of an electronic apparatus. The top emission method is a method having a high utilization efficiency of light, in which a reflecting layer is formed between a first electrode (for example, anode) formed in the substrate side and the substrate while interposing the light emitting element, and light is extracted from a second electrode (for example, cathode) side where the light emitting element is interposed.

In the light emitting device of the top-emission scheme, a technique (for example, SID2010 P-146/S. Lee, Samsung Mobile Display Co., Ltd) which may enhance light extraction efficiency by resonating light having a predetermined wavelength between the second electrode and the reflecting layer using a white organic EL element has been disclosed. In this technique, when a peak wavelength in a resonance structure is denoted as λ, an optical distance of the second electrode from the reflecting layer is denoted as D, a phase shift in the reflection by the first electrode is denoted as $\phi_L$, a phase shift in the reflection by the second electrode is denoted as $\phi_U$, and an integer is denoted as m, an optical structure satisfying the following equation has been suggested.

$$D=\{(2\pi m+\phi_L+\phi_U)/4\pi\}\lambda \quad (1)$$

In particular, in the above equation (1), when m=0 is satisfied, light having a wide wavelength can be extracted with some efficiency while simplifying an array structure in the organic EL element, and therefore, a low cost light emitting device may be realized, and high-definition pixels may be to be created easily.

However, in the light emitting device of an optical structure obtained when m=0 is satisfied in the above equation (1), light of all regions of a red region, a green region, and a blue region is extracted, and therefore it is necessary that color separation of each of a red pixel, a green pixel, and a blue pixel is performed by a color filter, or the like. Accordingly, there has been a problem that a bandwidth of an emission spectrum on an observation side is wide resulting in poor color purity. In addition, there has been a problem that when compared in each of a red wavelength region, a green wavelength region, and a blue wavelength region, light extraction efficiency is reduced. As a result, there has been a problem that the power consumption of the light emitting device is increased, and light extraction efficiency is a disadvantageous as panel characteristic.

In addition, in order to improve the light extraction efficiency, it may be considered that a structure is changed for each pixel of each color, for example, the above described optical distance D is changed for each pixel of each color, and the like; however, in a manufacturing method of the light emitting device in the related art, the number of manufacturing processes is increased resulting in an increase in manufacturing costs.

SUMMARY

An advantage of some aspects of the invention is that, in a top emission light emitting device in which a white organic EL element and a resonance structure are combined, light extraction efficiency of at least one color may be enhanced while an array structure in the organic EL element is simplified, thereby suppressing high power consumption.

In addition, in a manufacturing method of the light emitting device, a manufacturing process may be simplified, and light extraction efficiency may be enhanced at low cost.

According to an aspect of the invention, there is provided a light emitting device, including a substrate; a light reflecting layer that is formed on the substrate; a light emitting layer that is formed on the light reflecting layer; and an electrode that is formed on the light emitting layer, wherein, an optical path length in a resonance structure between the light reflecting layer and the electrode is adjusted, wherein $$D=\{(2\pi m+\phi_L+\phi_U)/4\pi\}\lambda \quad (2)$$

is satisfied when the optical path length between the light reflecting layer and the electrode is D, a phase shift in reflection by the light reflecting layer is $\phi_L$, a phase shift in reflection by the electrode is $\phi_U$, a peak wavelength of a standing wave generated between the light reflecting layer and the electrode is λ, and an integer of 2 or less is m, and wherein among the red pixel, green pixel and blue pixel light reflecting layers, at least one is made of a different metal material from the metal material used in the other light reflecting layers.

According to the aspect of the invention, the above equation (2) may be satisfied, and at least one of the red, green, and blue pixel light reflecting layers may be made of the metal material different from the metal material used in the other light reflecting layers. Accordingly, a phase shift amount in at least one of the light reflecting layers is different, and light extraction efficiency also is different in comparison with a case in which the pixel light reflecting layers of the colors are made of the same metal material. Therefore, light extraction efficiency of an emission color which affects the power consumption may be improved, and the power consumption may be reduced.

In the light emitting device according to the invention, when a phase shift amount is φ, a refractive index of the light emitting layer is $n_1$, a refractive index of the reflecting layer is $n_2$, and an extinction coefficient of the reflecting layer is $k_2$, $$\phi=\tan^{-1}\{2n_1k_2/(n_1^2-n_2^2-k_2^2)\} \quad (3)$$

may be satisfied, and the pixel reflecting layer of a color with a longer wavelength than that of the pixels of the other colors may be made of a metal material having a smaller phase shift amount φ than that of the pixel reflecting layer of the other colors.

In the light emitting device according to the invention, the above equation (3) may be satisfied, and the pixel reflecting layer of a color with a longer wavelength than that of the pixels of the other colors may be made of the metal material having a smaller phase shift amount φ than that of the pixel reflecting layer of the other colors, and therefore, extraction efficiency of light on the longer wavelength side may be improved, and the power consumption may be reduced.

In the light emitting device according to the invention, a value of the integer m may be 0. In the light emitting device according to the invention, the value of the integer m is 0, and therefore, the extraction efficiency of light may be improved while a structure from the light reflecting layer to the electrode is simplified, and the power consumption may be reduced.

In the light emitting device according to the invention, the green and blue pixel reflecting layers, or the red and green pixel reflecting layers may be made of the same metal material.

In the light emitting device according to the invention, the green and blue pixel reflecting layers, or the red and green pixel reflecting layers may be made of the same metal material, and therefore, light extraction efficiency of an emission color which affects the power consumption may be improved, and the power consumption may be reduced.

In the light emitting device according to the invention, the red or green pixel reflecting layer may be made of Cu, Au, or Ag, or a metal material which is mainly composed of at least one of Cu, Au, and Ag. In the light emitting device according to the invention, extraction efficiency of light of a longer wavelength side may be improved in comparison with a case in which the pixel reflecting layers of all of the colors is made of Al, and the power consumption may be reduced.

In the light emitting device according to the invention, a color filter may be provided on an upper layer of the electrode. In the light emitting device according to the invention, extraction efficiency of light may be improved while a simple structure in which the color filter is provided on the upper layer of the electrode is realized, and the power consumption may be reduced.

According to another aspect of the invention, there is provided a manufacturing method of a light emitting device, including forming a circuit element thin film on a substrate; forming a reflecting layer and pixel electrode on the substrate; forming a light emitting layer on the reflecting layer and pixel electrode; and forming a counter electrode on the light emitting layer, wherein, in the manufacturing method of the light emitting device in which an optical path length D is set so that $$D=\{(2\pi m+\phi_L+\phi_U)/4\pi\}\lambda \quad (4)$$

is satisfied when an optical path length between the reflecting layer, and pixel electrode, and the counter electrode is D, a phase shift in reflection on the reflecting layer and pixel electrode is $\phi_L$, a phase shift in reflection on the counter electrode is $\phi_U$, a peak wavelength of a standing wave generated between the reflecting layer and pixel electrode, and the counter electrode is $\lambda$, and an integer of 2 or less is m, and wherein the forming of the reflecting layer and pixel electrode is forming the reflecting layer and pixel electrode so as to be brought into direct contact with the circuit element thin film with respect to pixels of at least one color, the forming of the reflecting layer and pixel electrode further includes forming upper and lower conduction layers so as to be brought into direct contact with the circuit element thin film with respect to pixels of the other colors, the forming of the reflecting layer and pixel electrode with respect to the pixels of the other colors is forming the reflecting layer and pixel electrode on the upper and lower conduction layers, the forming of the reflecting layer and pixel electrode with respect to the pixels of at least one color and the forming of the upper and lower conduction layers with respect to the pixels of the other colors are the same, and the forming of the reflecting layer and pixel electrode with respect to the pixels of at least one color is forming the reflecting layer and pixel electrode using a metal material different from a metal material which is used in the forming of the reflecting layer and pixel electrode with respect to the pixels of the other colors.

According to the other aspect of the invention, the above equation (4) may be satisfied, and the pixel reflecting layer and pixel electrode of at least one color of the red, green, and blue pixel reflecting layer and pixel electrodes may be made of the metal material different from the metal material which is used in the pixel reflecting layer and pixel electrode of the other colors. Moreover, the forming of the reflecting layer and pixel electrode of the pixels of at least one color and the forming of the upper and lower conduction layers of the pixels of the other colors may be the same. Accordingly, in comparison with a case in which the pixel reflecting layer and pixel electrodes of all of the colors are made of the same metal material, a phase shift amount in the pixel reflecting layer and pixel electrode of at least one color may be different, and light extraction efficiency may also be different. In addition, since forming the reflecting layer and pixel electrode of the pixels of at least one color and the forming of the upper and lower conduction layers of the pixels of the other colors may be the same, it is possible to simplify the manufacturing method.

In the manufacturing method of the light emitting device according to the invention, the forming of the reflecting layer and pixel electrode with respect to the pixels of at least one color may be forming the pixel reflecting layer and pixel electrode of a color having a longer wavelength than that of the pixels of the other colors, using a metal material having a smaller phase shift amount $\phi$ than that of the reflecting layer and pixel electrode in the pixels of the other colors, so that $$\phi=\tan^{-1}\{2n_1k_2/(n_1^2-n_2^2-k_2^2)\} \quad (5)$$

is satisfied when a phase shift amount is $\phi$, a refractive index of the light emitting layer is $n_1$, a refractive index of the reflecting layer and pixel electrode is $n_2$, and an extinction coefficient of the reflecting layer and pixel electrode is $k_2$.

In the manufacturing method of the light emitting device according to the invention, the above equation (5) is satisfied, the reflecting layer and pixel electrode in the pixels of the color having a longer wavelength than that of the pixels of the other colors may be made of the metal material having the smaller phase shift amount $\phi$ than that of the reflecting layer and pixel electrode in the pixels of the other colors, and therefore, extraction efficiency of light of a longer wavelength side may be improved, and the power consumption may be reduced.

In the manufacturing method of the light emitting device according to the invention, the pixels of at least one color may be red pixels, or red pixels and green pixels.

In the manufacturing method of the light emitting device according to the invention, the green and blue pixel reflecting layer and pixel electrodes or the red and green pixel reflecting layer and pixel electrodes may be made of the same metal material, and therefore, light extraction efficiency of an emission color which affects the power consumption may be improved, and the power consumption may be reduced.

In the manufacturing method of the light emitting device according to the invention, the forming of the reflecting layer and pixel electrode with respect to the pixels of at least one color may be forming the reflecting layer and pixel electrode using Cu, Au, and Ag or a metal material which is mainly composed of Cu, Au, and Ag with respect to red pixels or the red pixels and green pixels. In the manufacturing method of the light emitting device according to the invention, in comparison with a case in which the reflecting layer in the pixels of all of the colors is made of Al, extraction efficiency of light of a longer wavelength side may be improved, and the power consumption may be reduced.

The manufacturing method of the light emitting device according to the invention may further include forming a diffusion prevention layer between the upper and lower conduction layers and the reflecting layer and pixel electrode with respect to the pixels of the other colors. According to the invention, it is possible to prevent a reduction in reflectance due to diffusion at an interface.

In the manufacturing method of the light emitting device according to the invention, the diffusion prevention layer may be formed using Ti, TiN, W, Ta, Mo or an alloy which is mainly composed of Ti, TiN, W, Ta, and Mo. According to the invention, it is possible to prevent a reduction in reflectance due to diffusion at an interface.

In the manufacturing method of the light emitting device according to the invention, a color filter may be formed on a counter electrode. In the manufacturing method of the light emitting device according to the invention, extraction efficiency of light may be improved while a simple structure in which the color filter is provided on an upper layer of the electrode is realized, and the power consumption may be reduced.

According to still another aspect of the invention, there is provided an electronic apparatus which may include the above described light emitting device. Since the electronic device according to the still other aspect of the invention may include the above described light emitting device, it is possible to reduce the power consumption.

BRIEF DESCRIPTION OF THE DRAWINGS

The invention will be described with reference to the accompanying drawings, wherein like numbers reference like elements.

FIG. 10 is a diagram illustrating a configuration of an organic layer film thickness and a reflecting layer in comparative example 1 and example 1 or example 3.

FIG. 11 is a diagram illustrating results of a color range and power consumption in comparative example 1, and example 1 or example 3.

FIG. 14 is a diagram illustrating a configuration of an organic layer film thickness and a reflective film of comparative example 2, and example 4 or example 5.

FIG. 15 is a diagram illustrating results of a color range and power consumption in comparative example 2, and example 4 or example 5.

FIGS. 19A and 19B are process diagrams for explaining a manufacturing method of a light emitting device according to a second embodiment of the invention, in which FIG. 19A is a diagram illustrating a state in which a circuit element thin film and an interlayer insulating film are formed on a first substrate, and FIG. 19B is a diagram illustrating a state in which an isolation film is formed between pixels.

FIGS. 20A and 20B are process diagrams for explaining a manufacturing method of the light emitting device according the embodiment of the invention, in which FIG. 20A is a diagram illustrating a state in which upper and lower conduction films are formed, and FIG. 20B is a diagram illustrating a state in which the upper and lower conduction films are flattened.

FIGS. 21A and 21B are process diagrams for explaining the manufacturing method of the light emitting device of the embodiment, in which FIG. 21A is a diagram illustrating a state in which a reflective film is formed on the upper and lower conduction layers, and FIG. 21B is a diagram illustrating a state in which an isolation film is formed between pixels.

FIGS. 22A and 22B are process diagrams for explaining the manufacturing method of the light emitting device of the embodiment, in which FIG. 22A is a diagram illustrating a state in which an OLED layer is formed, and FIG. 22B is a diagram illustrating a state in which a counter electrode is formed.

DESCRIPTION OF EXEMPLARY EMBODIMENTS

Hereinafter, various embodiments according to the invention will be described with reference to the accompanying drawings. In the drawings, a dimension and a ratio of each unit is appropriately different from an actual dimension and ratio.

First Embodiment

A: Structure of Light Emitting Device

Figure 1:
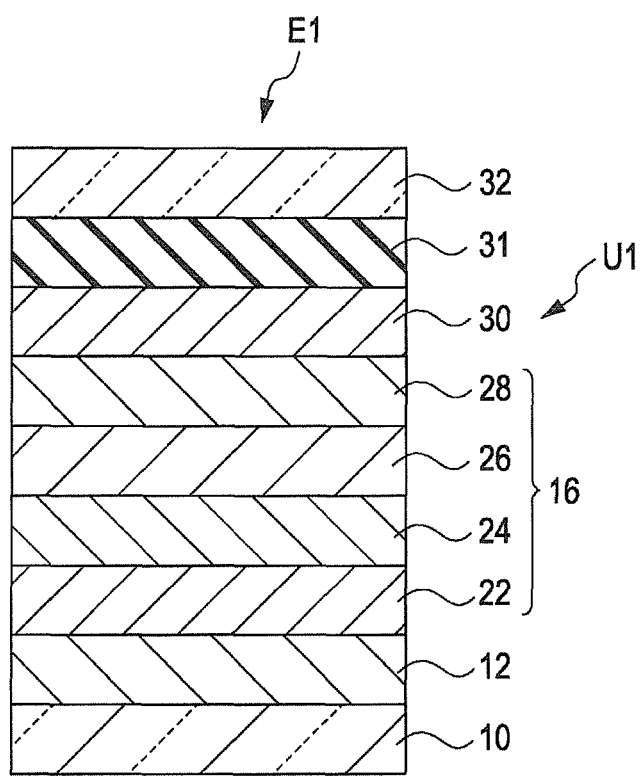
FIG. 1 is a schematic cross-sectional diagram illustrating an outline of a light emitting device according to a first embodiment of the invention.

FIG. 1 is a schematic cross-sectional diagram illustrating an outline of a light emitting device E1 according to a first embodiment of the invention. The light emitting device E1 has a configuration in which a plurality of light emitting elements U1 are arranged on a surface of a first substrate 10; however, in FIG. 1, for convenience of description, only a single light emitting element U1 is illustrated. The light emitting device E1 of the present embodiment is a top emission type, and light generated in the light emitting element U1 travels towards the opposite side of the first substrate 10. Accordingly, as the first substrate 10, an opaque plate material such as ceramic or metal sheet as well as a plate material with light transmittance such as glass, or the like may be adopted. In the present embodiment, a thickness of the first substrate 10 is 0.5 mm.

A wiring for emitting light by supplying electric power to the light emitting element U1 is disposed on the first substrate 10; however, the wiring is not illustrated. In addition, a circuit for supplying electric power to the light emitting element U1 is disposed on the first substrate 10; however, the circuit is not illustrated.

The light emitting element U1 includes a reflecting layer and pixel electrode 12 (first electrode) which is formed on the first substrate 10, a counter electrode 30 (second electrode) as a semitransparent reflecting layer on a light extraction side, which is disposed on the pixel electrode 12, and a light emitting functional layer 16 which is disposed between the reflecting layer and pixel electrode 12 and the counter electrode 30. Hereinafter, this will be described in detail. As illustrated in FIG. 1, the reflecting layer and pixel electrode 12 is formed on the first substrate 10. The reflecting layer and pixel electrode 12 is made of a material with light reflectivity. As the material of this kind, elemental metals such as Al (aluminum) Ag (silver), Au (gold), Cu (copper), and the like, alloys which are mainly composed of Au, Cu, or Ag, or the like may be appropriately adopted. In the present embodiment, the reflecting layer and pixel electrode 12 of the red light emitting element is made of Ag, Au, or Cu, and the reflecting layer and pixel electrode 12 of the green and blue light emitting elements may be made of Al. In the present embodiment, a film thickness of the reflecting layer and pixel electrode 12 is 80 nm.

As illustrated in FIG. 1, the light emitting functional layer 16 includes a hole injection layer 22 (HIL) which is formed on the reflecting layer and pixel electrode 12, a hole transport layer 24 which is formed on the hole injection layer 22, a light emitting layer 26 (EML) which is formed on the hole transport layer 24 (HTL), and an electron transport layer 28 (ETL) which is formed on the light emitting layer 26.

Figure 2:
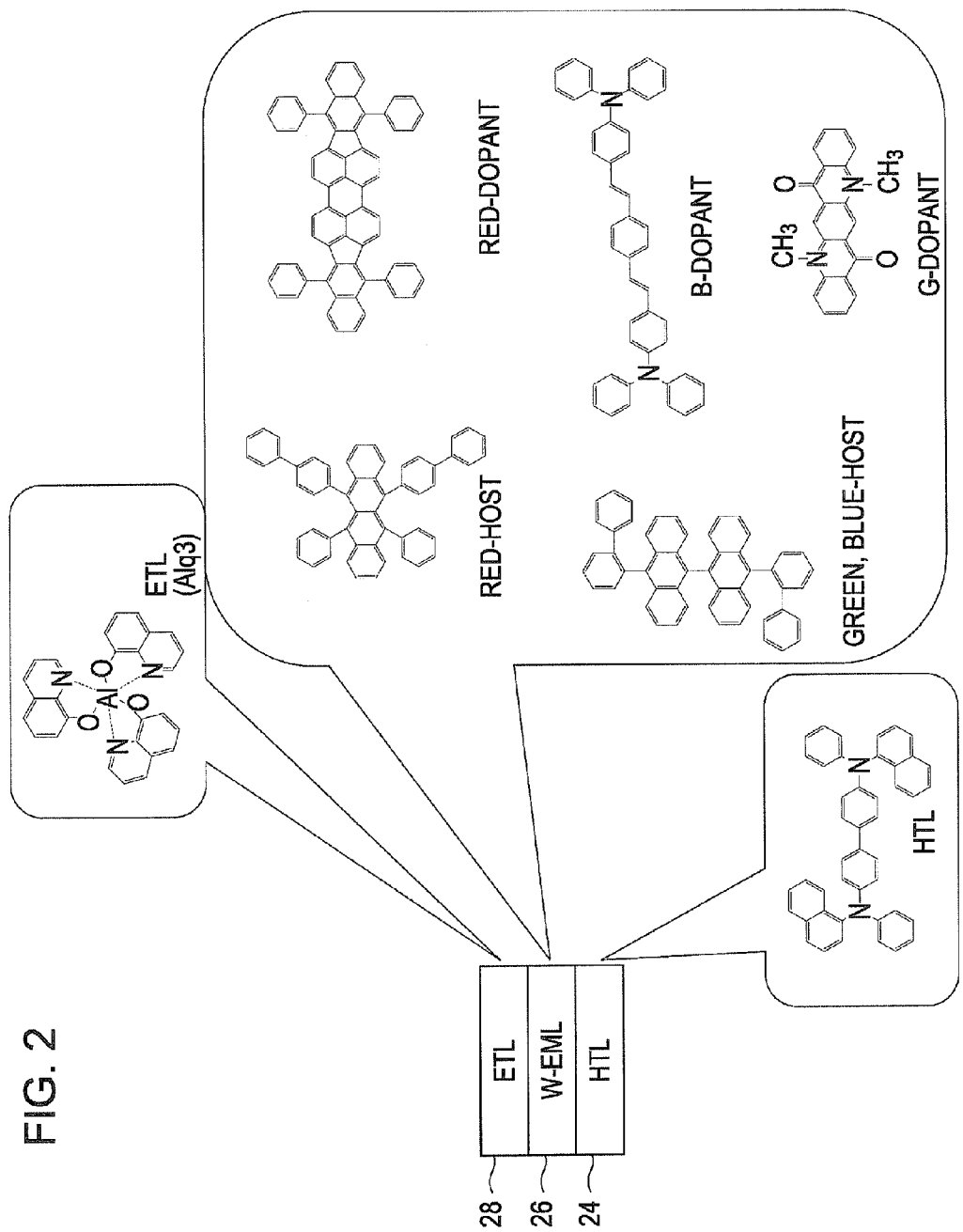
FIG. 2 is a diagram illustrating a material used in a hole transport layer, a light emitting layer, and an electron transport layer in FIG. 1.

In the present embodiment, the hole injection layer 22 is made of MoOx (molybdenum oxide), and the hole transport layer 24 is made of α-NPD as illustrated in FIG. 2. In the present embodiment, a film thickness of the hole injection layer 22 is 2 nm, and a film thickness of the hole transport layer 24 is 25 nm. In addition, the hole injection layer 22 and the hole transport layer 24 may be formed of a single layer serving also as the hole injection layer 22 and the hole transport layer 24.

The light emitting functional layer 26 is made of an organic EL material that emits light by combining holes and electrons. In the present embodiment, the organic EL material is a low molecular weight material, and emits white light. As a red host material and a red dopant material, and green and blue host materials, materials illustrated in FIG. 2 are used. In addition, DPAVBi is used as a blue dopant material. Quinacridone is used as a green dopant material. In the present embodiment, a film thickness of the light emitting functional layer 26 is 50 nm.

As illustrated in FIG. 2, the electron transport layer 28 is made of Alq3(tris 8-hydroxyquinolinato aluminium complex). In the present embodiment, a film thickness of the electron transport layer 28 is 25 nm.

The counter electrode 30 is a cathode, and is formed so as to cover the light emitting functional layer 16. The counter electrode 30 is continued over the plurality of light emitting elements U1. The counter electrode 30 serves as a semitransparent reflecting layer having properties of transmitting one part of light having reached a surface of the counter electrode 30 and reflecting the other part thereof (that is, semi-transmissive reflectivity), and is made of elemental metals such as magnesium, silver, and the like, or alloys which are mainly composed of magnesium or silver. In the present embodiment, the counter electrode 30 is made of MgAg (magnesium-silver alloy). A film thickness of the counter electrode 30 is 10 nm.

On the counter electrode 30, a passivation layer 31 that is a protection layer for preventing invasion of water or open air into the light emitting element U1 is formed, and is made of an inorganic material is formed. The passivation layer 31 is made of an inorganic material with low gas permeability such as SiN (silicon nitride), SiON (silicon oxynitride), or the like. In the present embodiment, the passivation layer 31 is made of SiN (silicon nitride). A film thickness of the passivation layer 31 is 400 nm.

In the present embodiment, the second substrate 32 is disposed so as to face the plurality of light emitting elements U1 formed on the first substrate 10. The second substrate 32 is made of a material with light transmittance such as glass, and the like. A thickness of the second substrate 32 is 0.5 mm. On a surface facing the first substrate 10, of the second substrate 32, a color filter and a light shielding film which are not illustrated are formed. The light shielding film is a film body of a light shielding body of which an opening is formed so as to face each of the light emitting elements U1. The color filter is formed within the opening.

In the present embodiment, a color filter for a red color that selectively transmits red light is formed in the opening corresponding to the red light emitting element U1, a color filter for a green color that selectively transmits green light is formed in the opening corresponding to the green light emitting element U1, and a color filter for a blue color that selectively transmits blue light is formed in the opening corresponding to the blue light emitting element U1.

In the light emitting element U1 of the invention, a resonator structure that resonates light emitted by the light emitting functional layer 16 between the reflecting layer and pixel electrode 12 and the counter electrode 30 as a semitransparent reflecting layer on a light extraction side is formed. Therefore, it is possible to efficiently extract light with a specific wavelength.

The second substrate 32 in which the color filter and the light shielding film are formed is bonded with the first substrate 10 through a sealing layer which is not illustrated. The sealing layer is made of a transparent resin material, for example, curable resin such as epoxy resin, or the like. The above is a structure of the light emitting device of the present embodiment.

B: Configuration of Reflecting Layer and Pixel Electrode

Next, a configuration of the reflecting layer and pixel electrode 12 in the light emitting device E1 of the invention will be described. The light emitting device E1 according to the invention adopts a resonance structure that generates a standing wave from the reflecting layer and pixel electrode 12 to the counter electrode 30, by setting, as a predetermined value, an optical distance from the reflecting layer and pixel electrode 12 to the counter electrode 30 as a semitransparent reflecting layer on a light extraction side.

Specifically, when the optical distance between the reflecting layer and pixel electrode 12 and the counter electrode 30 is D, a phase shift in the reflection in the reflecting layer and pixel electrode 12 that is a bottom electrode is $\phi_L$, a phase shift in the reflection in the counter electrode 30 that is a top electrode is $\phi_U$, a peak wavelength of a standing wave is $\lambda$, and an integer is m, a structure satisfying the following equation is obtained.

$$D=\{(2\pi m+\phi_L+\phi_U)/4\pi\}\lambda \quad (6)$$

When the above equation (6) is transformed, $$\lambda=4D\pi/(2\pi m+\phi_L+\phi_U) \quad (7)$$

is obtained. That is, when the phase shift at a reflective interface is small even in the same film thickness, the peak wavelength of the standing wave is shifted to a longer wavelength side. In particular, when m=0 is satisfied, $$\lambda=4D\pi/(\phi L+\phi U) \quad (8)$$

is obtained, and therefore, an influence of the phase shift at the reflective interface becomes great.

The phase shift is represented as the following equation when a phase shift amount is $\phi$[rad], a refractive index of the light emitting functional layer 16 is $n_1$, a refractive index of the counter electrode 30 is $n_2$, and an extinction coefficient of the counter electrode 30 is $k_2$.

$$\phi=\tan^{-1}\{2n_1k_2/(n_1^2-n_2^2-k_2^2)\} \quad (9)$$

Figure 3:
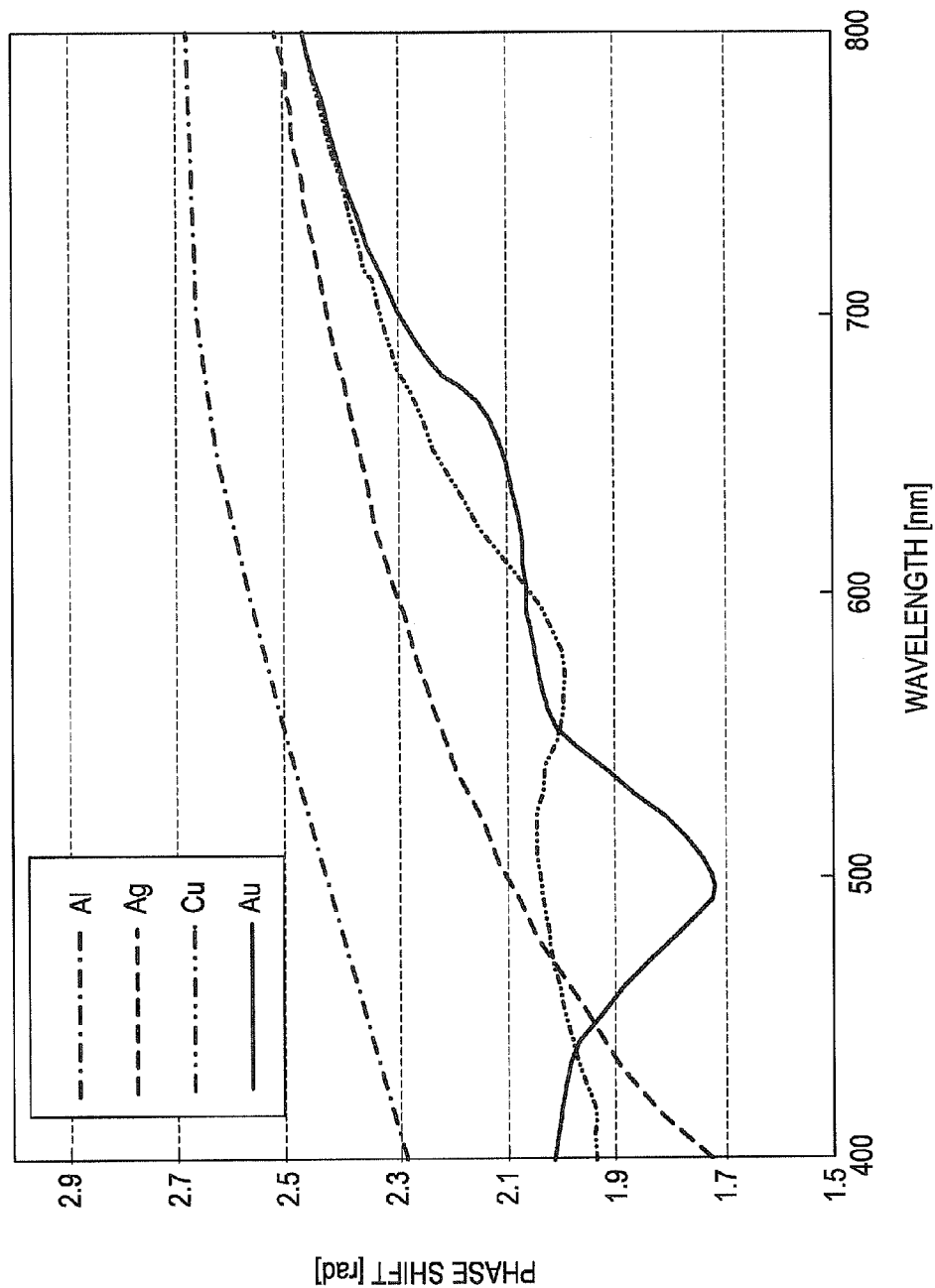
FIG. 3 is a diagram illustrating results obtained by calculating a phase shift amount using Al, Ag, Cu, and Au.
Figure 4:
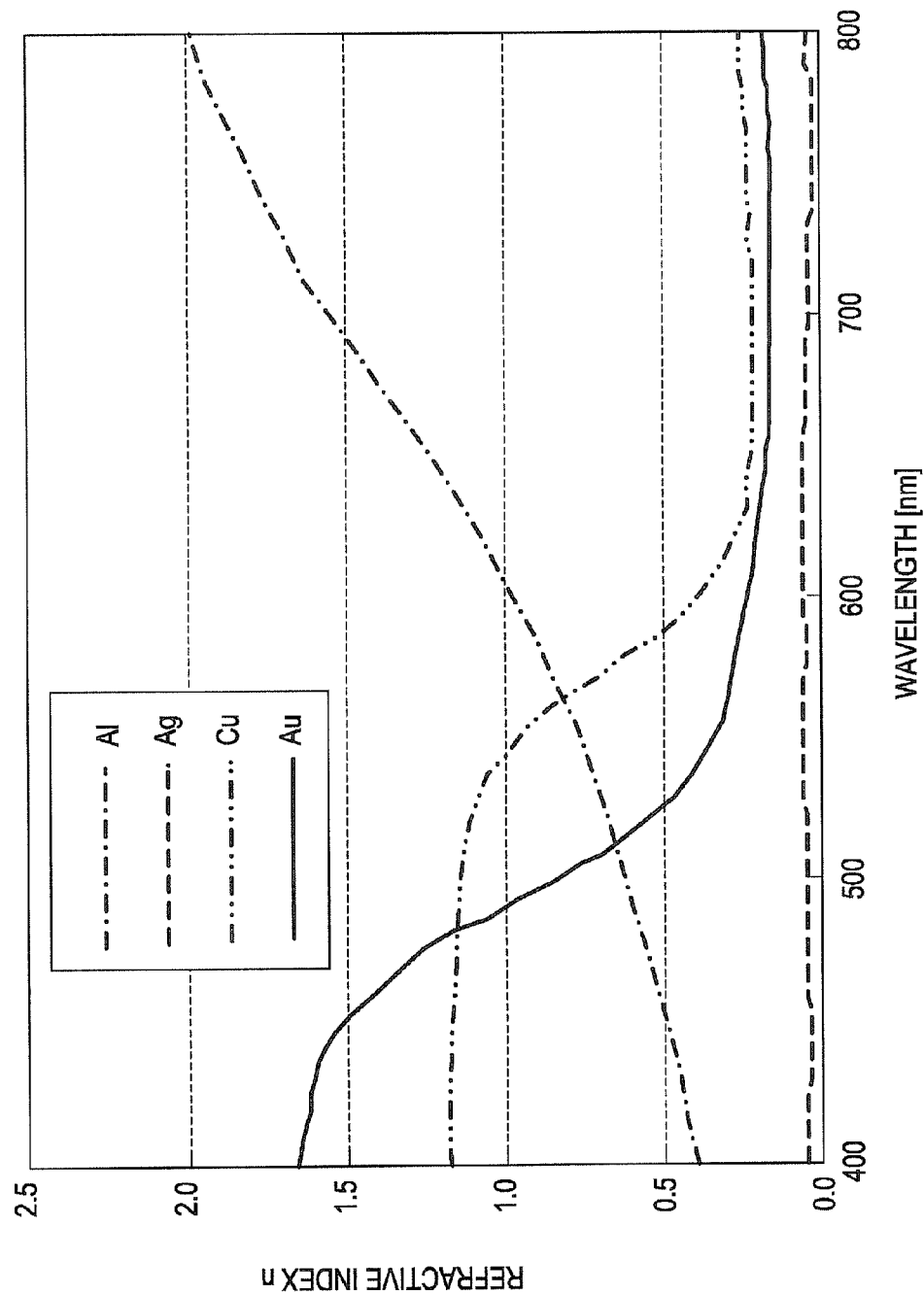
FIG. 4 is a diagram illustrating a change in a refractive index with respect to each wavelength of Al, Cu, Au, and Ag.
Figure 5:
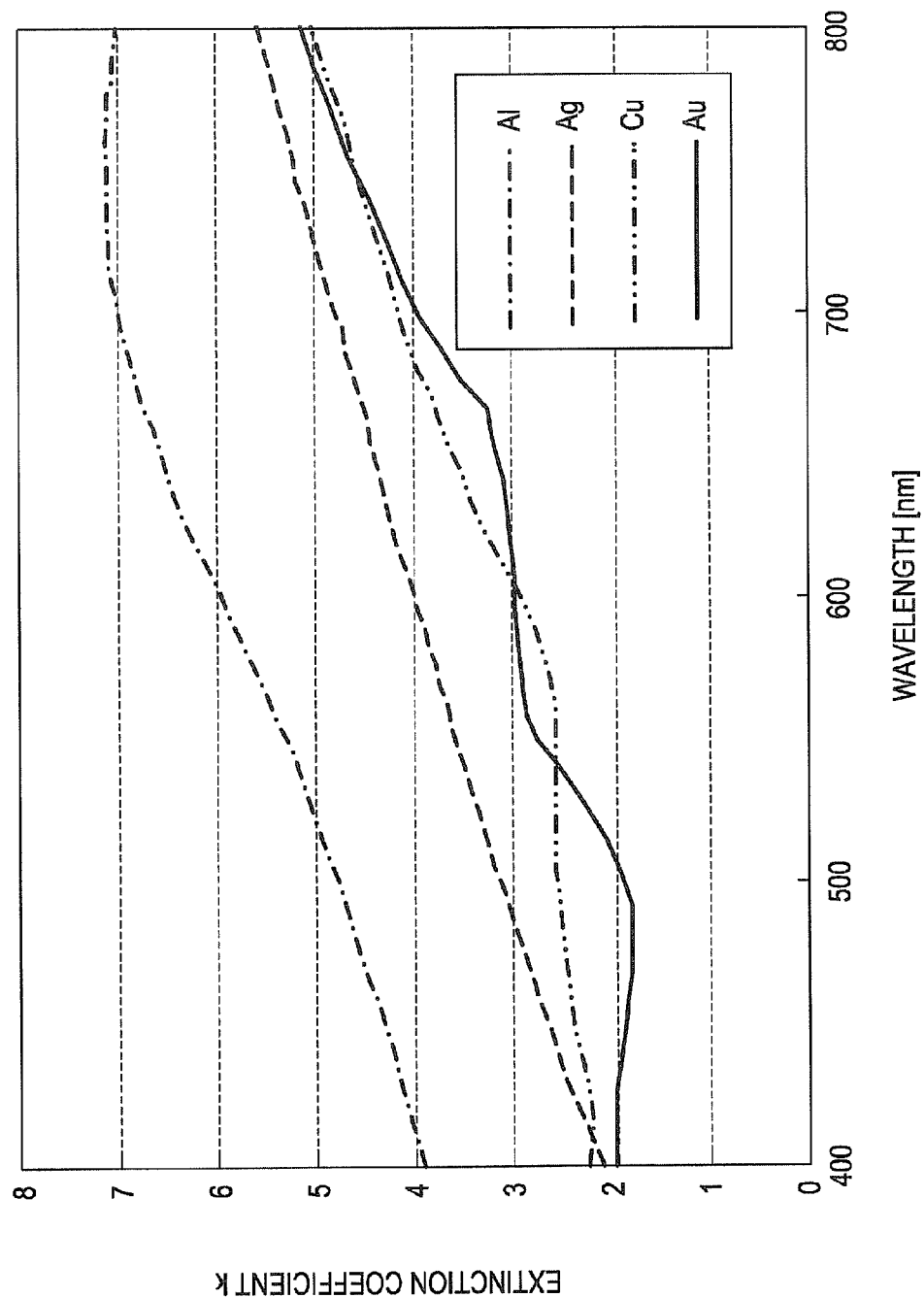
FIG. 5 is a diagram illustrating a change in an extinction coefficient with respect to each wavelength of Al, Cu, Au, and Ag.

In FIG. 3, the results obtained by calculating the phase shift amount using Al, Cu, Au, and Ag, which are representative metal materials, when the refractive index $n_1$ of the light emitting functional layer 16 is 1.8 are illustrated. In addition, a change in the refractive index n with respect to each wavelength of Al, Cu, Au, and Ag which are metal materials is illustrated in FIG. 4, and a change in the extinction coefficient k is illustrated in FIG. 5.

As is apparent from FIG. 3, it has been found that the phase shift amount in cases in which Cu, Au, and Ag are used was smaller in comparison with when Al is used as the metal material.

Figure 6:
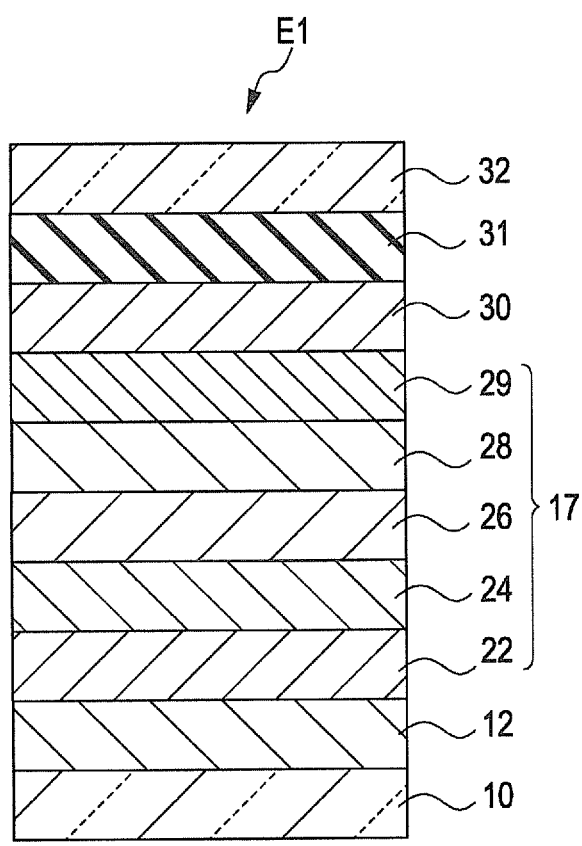
FIG. 6 is a schematic cross-sectional diagram illustrating an outline of a simulation model used in a simulation for examining an influence of a phase shift amount in a resonance structure.

In order to examine the influence of the phase shift amount in the resonance structure, when assuming a simulation model E2 as illustrated in FIG. 6, light extraction efficiency of the light emitting layer 26 is calculated. In addition, the simulation model E2 illustrated in FIG. 6 has substantially the same configuration as that of the light emitting device E1 illustrated in FIG. 1. However, the simulation model E2 is different from the light emitting device E1 illustrated in FIG. 1 in that the electron injection layer 29 is provided between the electron transport layer 28 and the counter electrode 30. The electron injection layer 29 is made of LiF, and formed on the electron transport layer 28 in the light emitting functional layer 17. In addition, the simulation model E2 is different from the light emitting device E1 illustrated in FIG. 1 in that SiON (silicon oxynitride) is used as the passivation layer 31.

In the simulation model E2, a thickness of the first substrate 10 is 0.5 mm, a film thickness of the reflecting layer and pixel electrode 12 is 150 nm, a film thickness of the hole injection layer 22 is 15 nm, a film thickness of the hole transport layer 24 is 25 nm, a film thickness of the light emitting layer 26 is 20 nm, a film thickness of the electron transport layer 28 is 35 nm, a film thickness of the electron injection layer 29 is 1 nm, a film thickness of the counter electrode 30 is 10 nm, a film thickness of the passivation layer 31 is 400 nm, and a thickness of the second substrate 32 is 0.5 mm.

Figure 7:
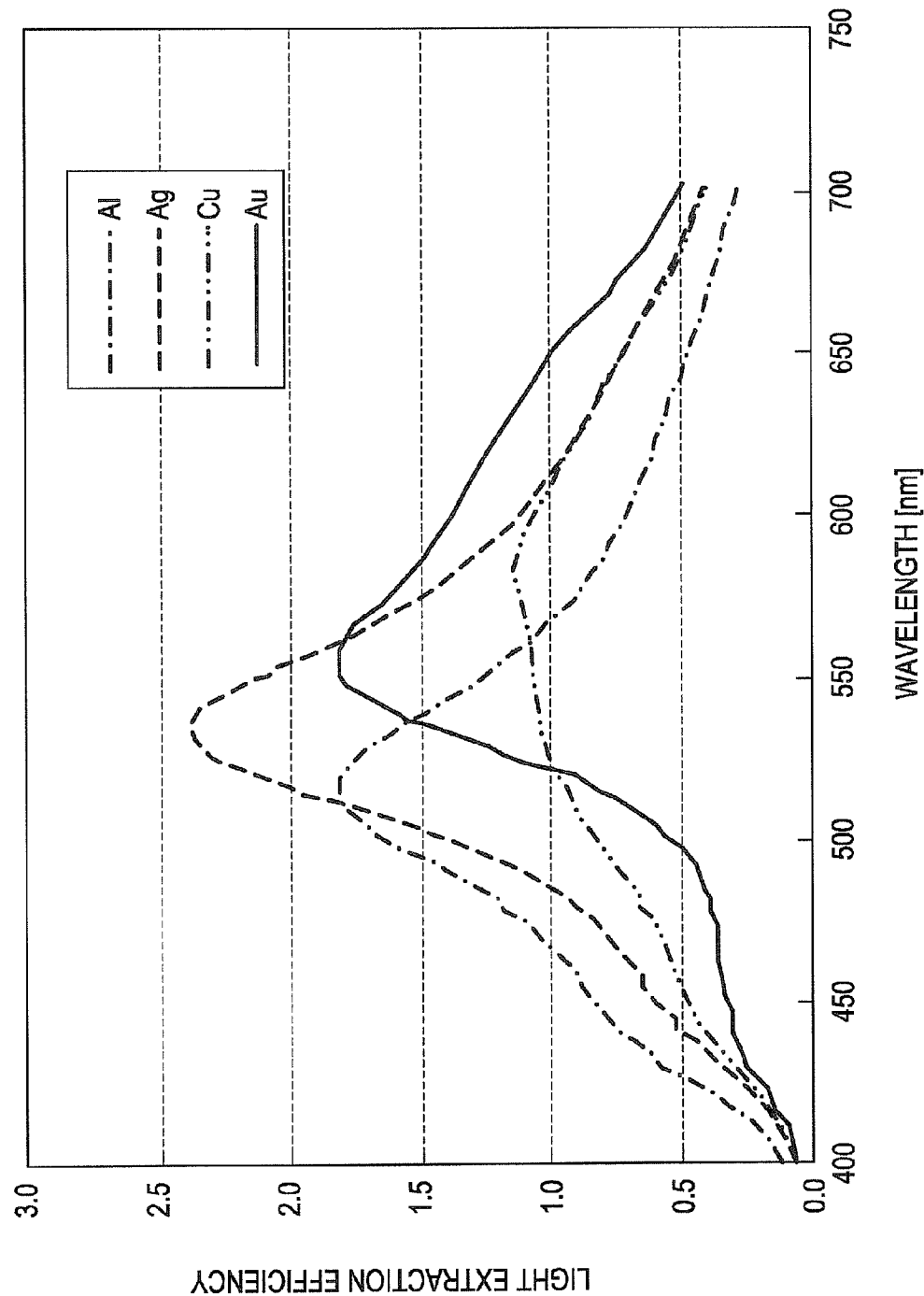
FIG. 7 is a diagram illustrating results obtained by calculating light extraction efficiency of a light emitting layer using the simulation model of FIG. 6.

In the simulation model E2 illustrated in FIG. 6, results obtained by calculating light extraction efficiency of the light emitting layer 26 using Al, Cu, Au, and Ag in the reflecting layer and pixel electrode 12 are illustrated in FIG. 7. In addition, in the calculation, a distance D between the reflecting layer and pixel electrode 12 and the counter electrode 30 as the semitransparent reflecting layer on the light extraction side is 96 nm.

As is apparent from FIG. 6, it has been found that the light extraction efficiency on a long wavelength side greater than or equal to 600 nm was improved when Cu, Au, and Ag each having a small phase shift are used in the reflecting layer and pixel electrode 12, in comparison with when Al is used.

Therefore, in the present embodiment, in the reflecting layer and pixel electrode 12 used in the light emitting element that emits red light, the light extraction efficiency of red light that is on the long wavelength side greater than or equal to 600 nm may be improved by adopting Cu and Au each having a small phase shift, or Ag. In both the reflecting layer used in the light emitting element that emits green light with a wavelength of 520 to 560 nm, and the light emitting element that emits blue light with a wavelength of 450 to 470 nm, Al is adopted. Due to such configuration, even in the light emitting device E1 of the present embodiment that adopts an optical structure of the case in which m=0 is satisfied in the above equation (2), it is possible to improve extraction efficiency of red light, and to significantly reduce the power consumption.

Figure 8:
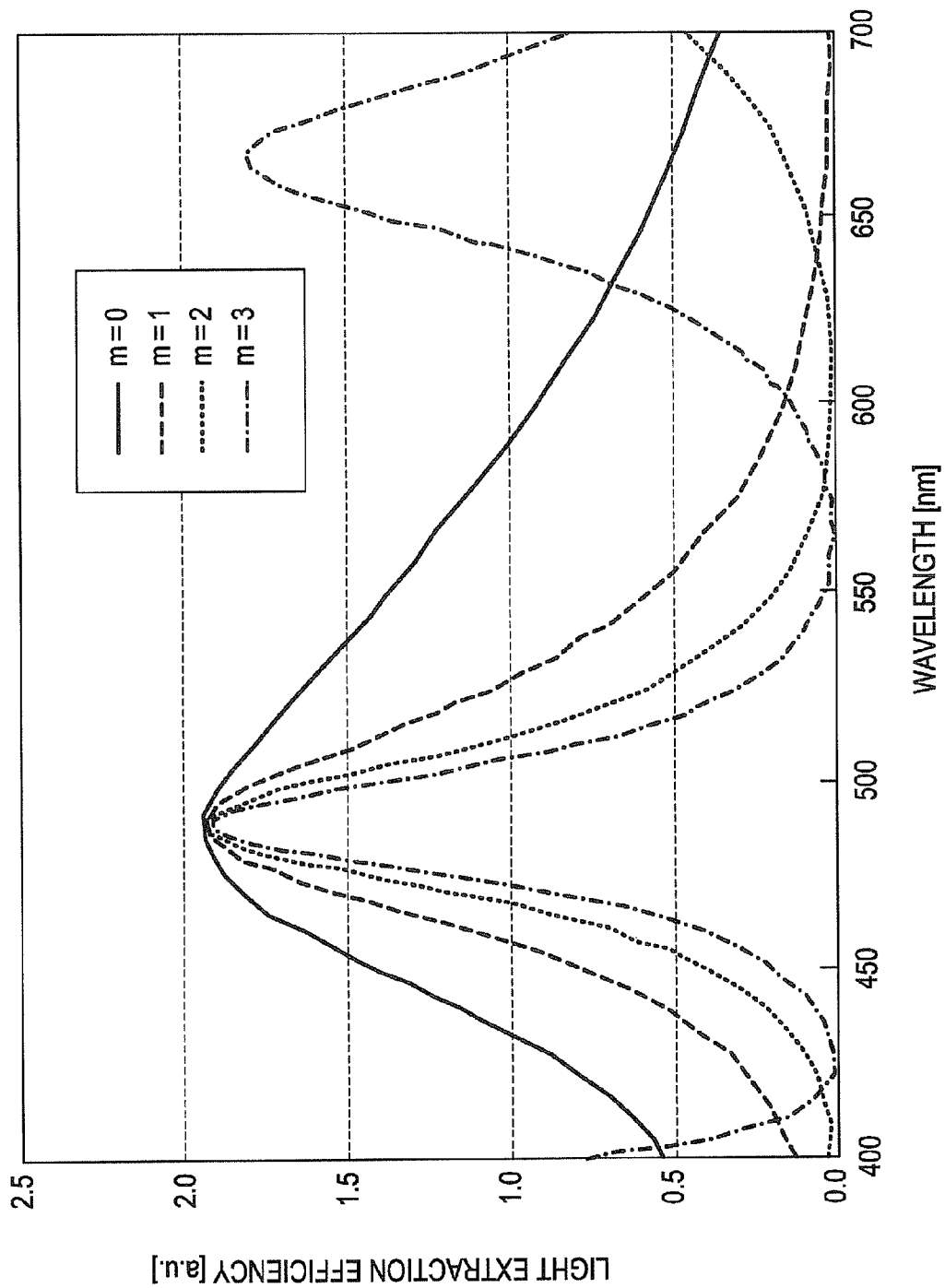
FIG. 8 is a diagram illustrating a relationship between a wavelength in each optical structure and light extraction efficiency when m=0, 1, 2, and 3 are satisfied.

In FIG. 8, in each optical structure of the case in which m=0, 1, 2, and 3 are satisfied, results obtained by calculating light extraction efficiency when a peak wavelength is 490 nm are illustrated. In addition, as preconditions for the calculation, a film thickness of the reflecting layer and pixel electrode 12 is set as 100 nm using Al, a film thickness of the light emitting layer 26 is set as 20 nm, a total film thickness of the electron transport layer 28 and the electron injection layer 29 is set as 40 nm, a film thickness of the counter electrode 30 is set as 10 nm using MgAg, and a film thickness of the passivation layer 31 is set as 400 nm using SiN. In addition, a total film thickness of the hole injection layer 22 and the hole transport layer 24 is adjusted so that a peak wavelength is 490 nm. In addition, a refractive index of each layer between the reflecting layer and pixel electrode 12 and the counter electrode 30 is set as 1.8. As illustrated in FIG. 8, it has been found that a range of a wavelength which can obtain high light extraction efficiency was increased in the optical structure of the case in which m=0 is satisfied rather than the optical structure of the case in which m=1, 2, and 3 are satisfied.

C: Panel Simulation

Next, in the reflecting layer and pixel electrode 12 used in the light emitting element that emits red light, a panel simulation that is carried out to confirm a reduction in the power consumption when using Cu, Au, or Ag with a small phase shift will be described.

In the panel simulation that has substantially the same configuration as that of the light emitting device E1 illustrated in FIG. 1, Al is adopted even in the light emitting elements of all of the colors as the reflecting layer and pixel electrode is used as a comparison example. In addition, in the light emitting device E1 illustrated in FIG. 1, Cu, Au, or Ag having a smaller phase shift in the reflecting layer and pixel electrode 12 used in the light emitting element that emits red light is adopted is used as an example.

Figure 9:
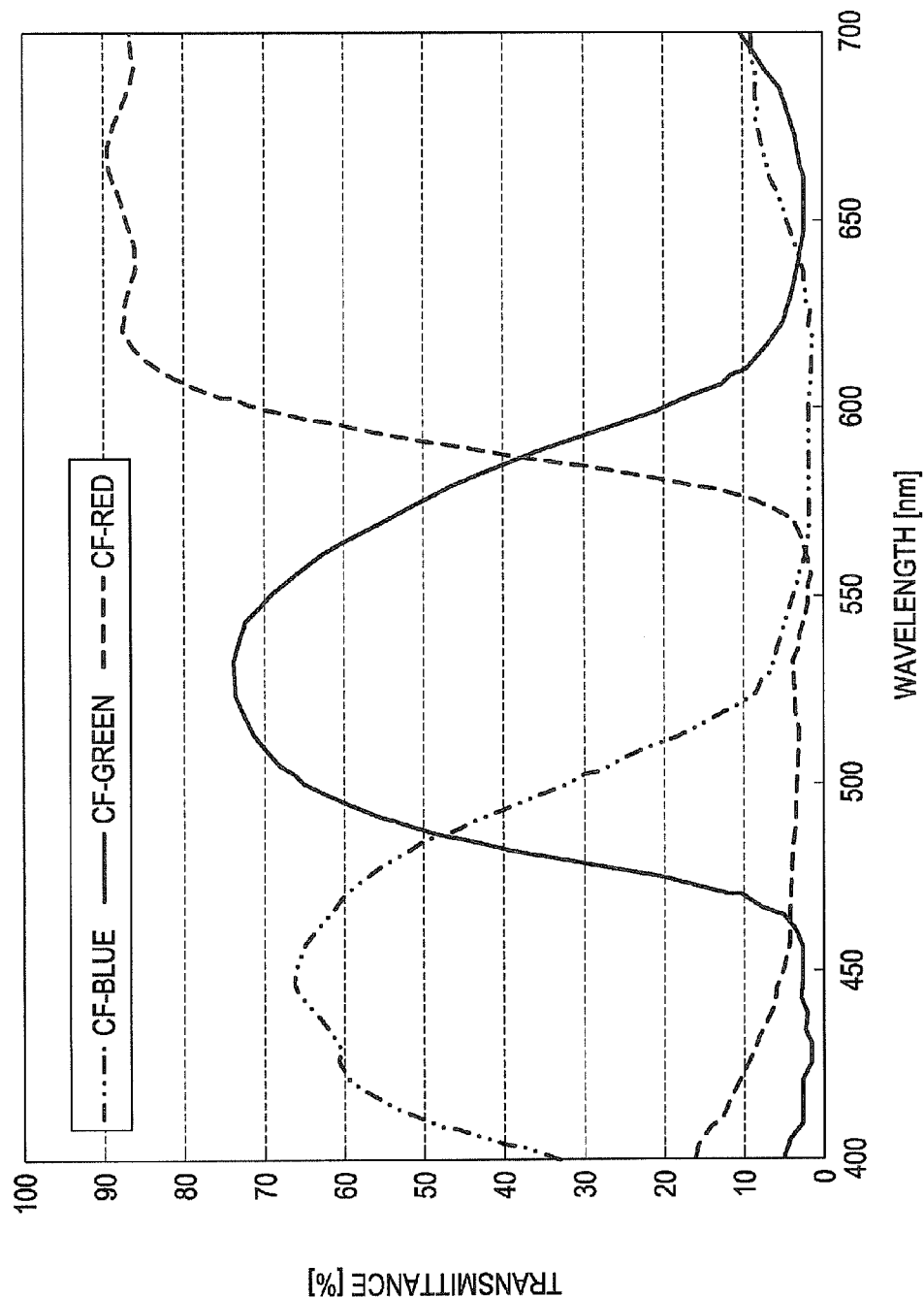
FIG. 9 is a diagram illustrating transmittance of a color filter used in the simulation model of FIG. 6.

In addition, in the simulation, as illustrated in FIG. 9, a color filter of which a transmittance with respect to light greater than or equal to 600 nm is 90% is used as a red color filter. As a green color filter, a color filter of which a transmittance with respect to light greater than or equal to 520 to 560 nm is 65% to 70% is used. As a blue color filter, a color filter of which a transmittance with respect to light greater than or equal to 430 to 470 nm is 60% to 65% is used.

C-1: Structure of Comparative Example 1

A structure of an organic layer in a comparative example 1 was the same as that illustrated in FIG. 1, and a film thickness was set as 100 nm as illustrated in FIG. 10. In addition, as for all pixels of red pixels, green pixels, and blue pixels, the reflecting layer and pixel electrode was composed of Al.

C-2: Structure of Example 1

A structure of an organic layer in an example 1 was the same as that illustrated in FIG. 1, and a film thickness was set as 100 nm as illustrated in FIG. 10. Au was adopted as the red pixel reflecting layer and pixel electrode 12, and Al was adopted as the green and blue pixel reflecting layer and pixel electrode 12.

C-3: Structure of Example 2

A structure of an organic layer in an example 2 was the same as that illustrated in FIG. 1, and a film thickness was set as 100 nm as illustrated in FIG. 10. Cu was adopted as the red pixel reflecting layer and pixel electrode 12, and Al was adopted as the green and blue pixel reflecting layer and pixel electrodes 12.

C-4: Structure of Example 3

A structure of an organic layer in an example 3 was the same as that illustrated in FIG. 1, and a film thickness was set as 100 nm as illustrated in FIG. 10. Ag was adopted as the reflecting layer and pixel electrode 12 of the red pixels, and Al was adopted as the reflecting layer and pixel electrode 12 of the green pixels and the blue pixels.

That is, the red pixels, the green pixels, and the blue pixels of the comparative example 1, and the green pixels and the blue pixels of examples 1 to 3 had the same structure.

C-5: Result of Panel Simulation

As illustrated in FIG. 11, when the power consumption of the comparative example 1 was standardized as 1.00, the power consumption of the example 1 was 0.80, the power consumption of the example 2 was 0.82, and the power consumption of the example 3 was 0.85, and therefore it has been found that the power consumption in all examples was reduced by about 20%.

In addition, as for a color range (NTSC cover ratio in an xy chromaticity diagram), the color range was 76.42% in the example 1, the color range was 76.28% in the example 2, and the color range was 75.69% in the example 3, and therefore it has also been found that all color ranges were widened in comparison with 75.14% in the comparative example 1.

Figure 12:
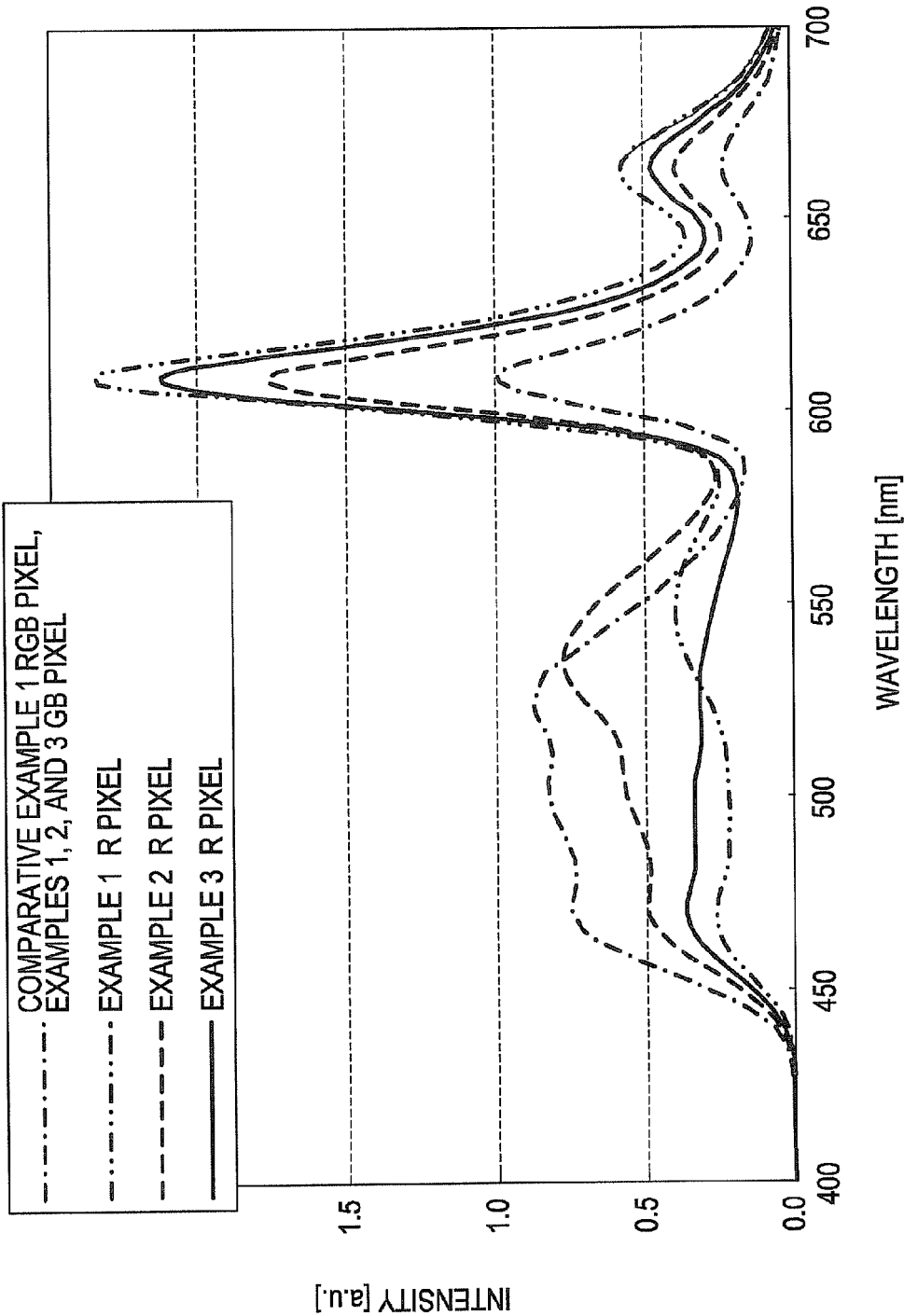
FIG. 12 is a diagram illustrating intensity of light in each pixel in comparative example 1, and example 1 or example 3.

In addition, in FIG. 12, intensity of light of red pixels, green pixels, and blue pixels in the comparative example 1, the example 1, the example 2, and the example 3 is illustrated. As can be seen from FIG. 12, in the red pixels of the example 1, the example 2, and the example 3, it has been found that intensity of each of green light and blue light was reduced in comparison with the comparative example 1, whereas intensity of light at the vicinity of 600 nm that was a red wavelength was increased in comparison with other wavelengths. That is, in the present embodiment, extraction efficiency of red light was improved. In addition, in the green pixels and blue pixels of the example 1, the example 2, and the example 3, it has been found that intensity of light of a green region (520 to 560 nm) and a blue region (450 to 470 nm) did not differ from that of the comparative example 1.

Figure 13:
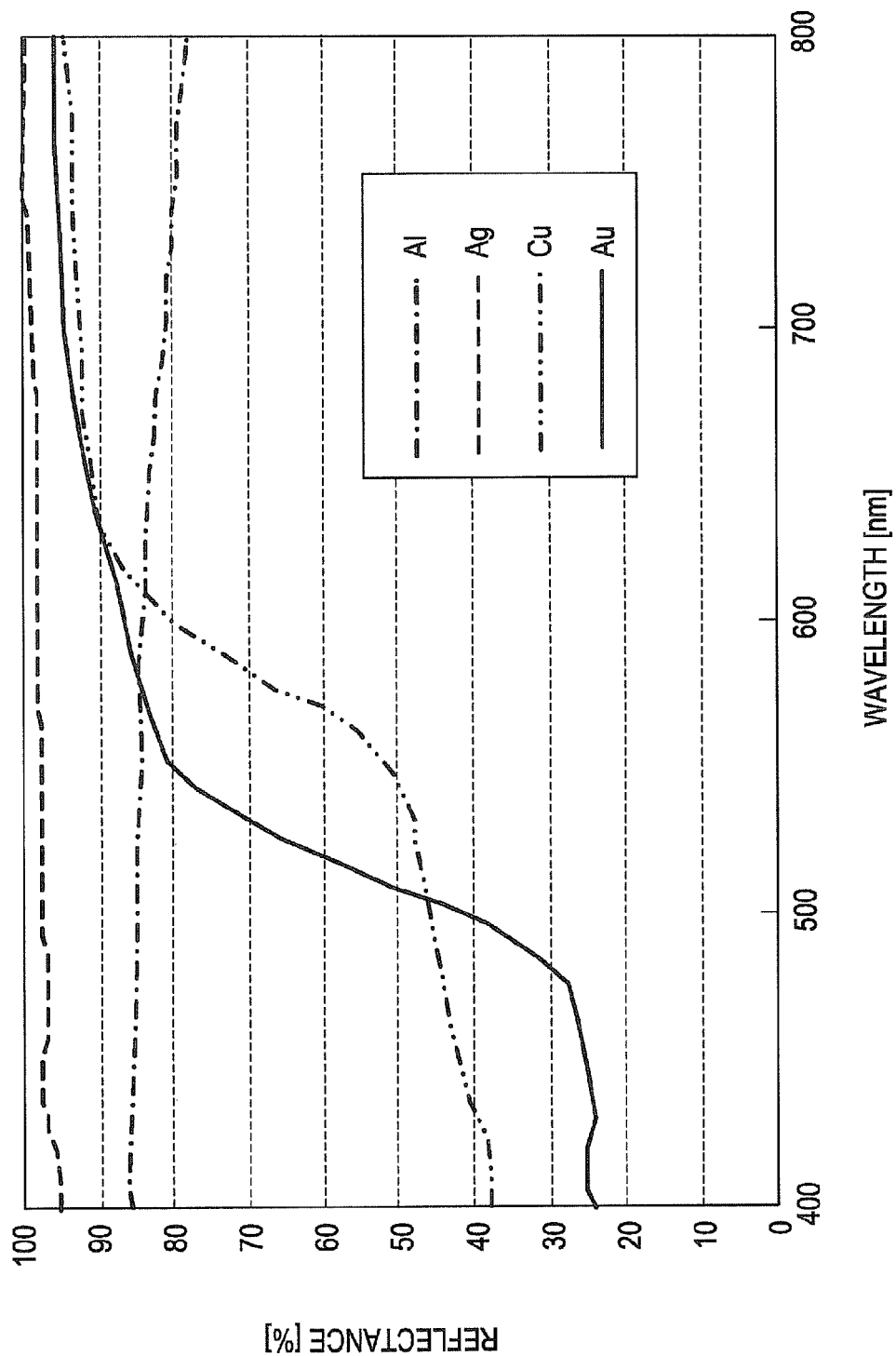
FIG. 13 is a diagram illustrating a change in reflectance with respect to each wavelength of Al, Cu, Au, and Ag.

This can be seen from a graph of reflectance illustrated in FIG. 13. In FIG. 13, a graph showing reflectance at an interface of each of various metal reflecting layers of Al, Ag, Cu, and Au when a refractive index of the light emitting functional layer 16 is 1.8 is illustrated. In order to increase the light extraction efficiency, high reflectance may be preferable; however, when Au and Cu were used in the reflecting layer as illustrated in FIG. 13, it has been found that high reflectance was shown in a red region with a wavelength greater than or equal to 600 nm.

In particular, since the reflectance in a region with a shorter wavelength than that of the red region was low, it is suitable that Cu may be used in the red pixel reflecting layer. Since the reflectance in a region with a wavelength less than or equal to 550 nm was significantly reduced, it is suitable that Au may be used in the green pixel reflecting layer or the red pixel reflecting layer. In addition, since the reflectance of Au in the blue region was low, blue light emitting components in the red pixels were reduced, thereby improving color purity before being transmitted through a color filter.

As described above, according to the present embodiment, since Cu, Au, or Ag with a small phase shift was adopted as the reflecting layer and pixel electrode used in the red pixels, red light extraction efficiency may be improved in comparison with when Al was used as the reflecting layer and pixel electrode used in the red pixels in the light emitting device having the optical structure obtained when m=0 is satisfied in the above equation (6). As a result, the power consumption may be significantly reduced.

D: Modified Example

Next, in comparison with the comparative example 1, the example 1, the example 2, and the example 3, a modified example in which a film thickness of the organic layer was set as 90 nm will be described. In the modified example, the film thickness of the organic layer was set as 90 nm that is thinner by 10 nm than that in each of the comparative example 1, the example 1, the example 2, and the example 3, so that a structure in which extraction efficiency on a short wavelength side was increased was obtained. Adjustment of the film thickness was carried out by setting each film thickness of the electron transport layer 28 and the hole transport layer 24 as being thinner by 5 nm than that in each of the comparative example 1, the example 1, the example 2, and the example 3.

In the above described structure, the light emitting device in which Al was adopted as the reflecting layer and pixel electrode in the light emitting elements of all of the colors was used as a comparative example 2. In addition, the light emitting device in which Au, Cu, or Ag with a small phase shift is adopted in the reflecting layer and pixel electrode 12 used in the light emitting element that emits red light was used as an example 4, an example 5, and an example 6. The light emitting element used in the panel simulation basically has the structure illustrated in FIG. 1, and a configuration of the reflecting layer and pixel electrode 12 is different in the comparative example 2, the example 4, the example 5, and the example 6 which will be described below.

D-1: Structure of Comparative Example 2

A structure of an organic layer in the comparative example 2 was the same as that illustrated in FIG. 1, and a film thickness was set as 90 nm as illustrated in FIG. 13. In addition, as for all pixels of red pixels, green pixels, and blue pixels, the reflecting layer and pixel electrode was composed of Al.

D-2: Structure of Example 4

A structure of an organic layer in the example 4 was the same as that illustrated in FIG. 1, and a film thickness was set as 90 nm as illustrated in FIG. 14. Au was adopted as the red pixel reflecting layer and pixel electrode 12, and Al was adopted in the green and blue pixel reflecting layer and pixel electrodes 12.

D-3: Structure of Example 5

A structure of an organic layer in the example 5 was the same as that illustrated in FIG. 1, and a film thickness was set as 90 nm as illustrated in FIG. 14. Cu was adopted as the red pixel reflecting layer and pixel electrode 12, and Al was adopted in the green and blue pixel reflecting layer and pixel electrodes 12.

D-4: Structure of Example 6

A structure of an organic layer in the example 6 was the same as that illustrated in FIG. 1, and a film thickness was set as 90 nm as illustrated in FIG. 14. Ag was adopted as the reflecting layer and pixel electrode 12 of red pixels, and Al was adopted in the reflecting layer and pixel electrode 12 of green pixels and blue pixels.

That is, the red pixels, the green pixels, and the blue pixels of the comparative example 2, and the green pixels and the blue pixels of the examples 4 to 6 had the same structure.

D-5: Result of Panel Simulation

When the power consumption of the comparative example 1 illustrated in FIG. 10 was standardized as 1.00, it has been found that the power consumption of the comparative example 2 was 0.99 as illustrated in FIG. 15, which was barely changed in comparison with the comparative example 1.

However, the power consumption of the example 4 was 0.66, the power consumption of the example 5 was 0.68, and the power consumption of the example 6 was 0.75, and therefore it has been found that the power consumption was further significantly reduced even as compared with the examples 1 to 3.

In addition, as for a color range, the color range was 75.98% in the example 4, the color range was 75.72% in the example 5, and the color range was 75.19% in the example 6, and therefore it has been found that all color ranges were widened as compared with 74.36% in the comparative example 2.

Figure 16:
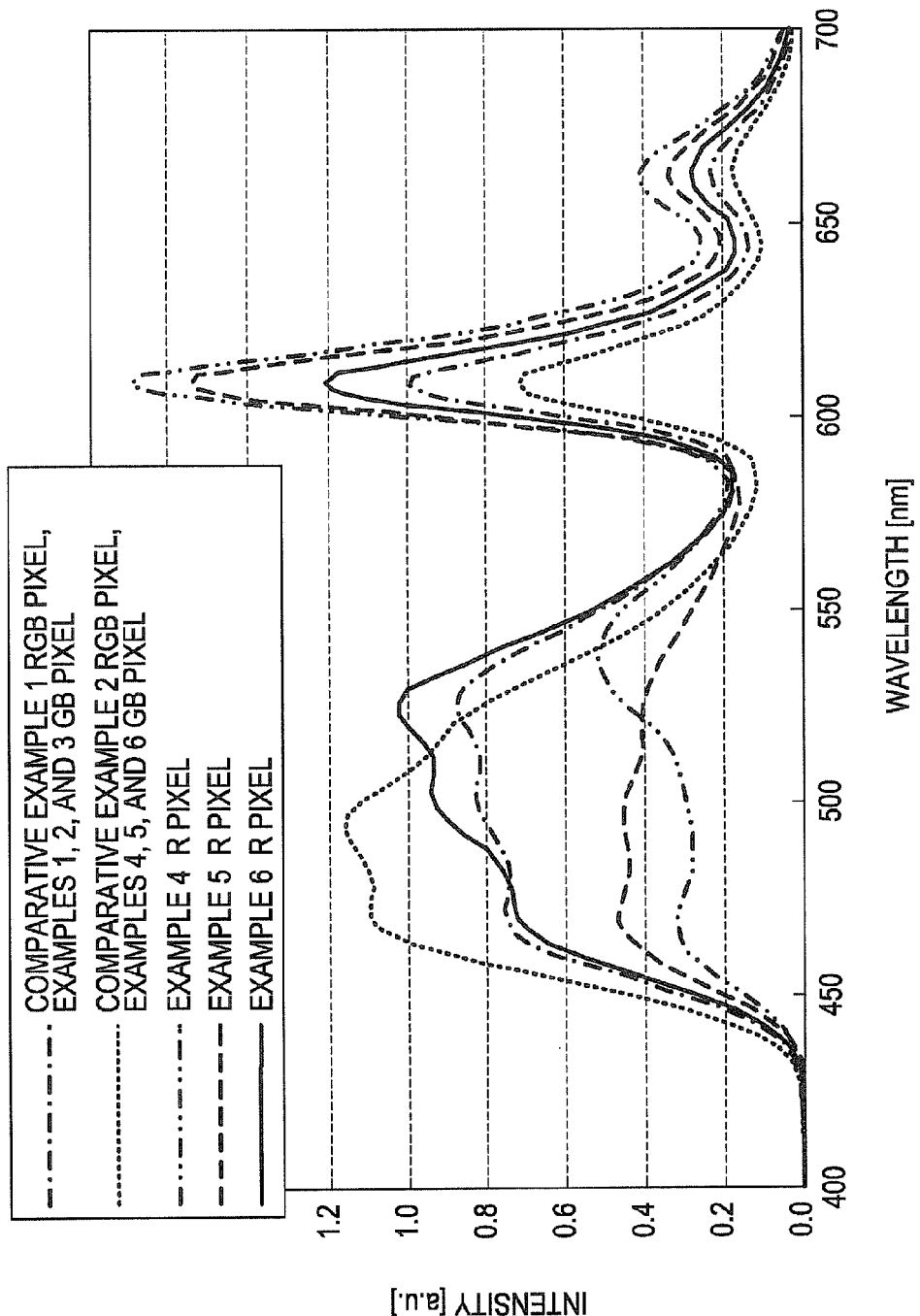
FIG. 16 is a diagram illustrating intensity of light in each pixel of comparative example 1 and comparative example 2, in green pixels and blue pixels of example 1 or example 3, and in red pixels of example 4 or example 6.

In FIG. 16, intensity of light of each color pixel in the comparative example 1 and the comparative example 2, intensity of light of green pixels and blue pixels in the example 1, the example 2, and the example 3, and intensity of light of each color pixel in the example 4, the example 5, and the example 6 are illustrated.

As can be seen from FIG. 16, even in all examples of the example 4, the example 5, and the example 6, it has been found that intensity of light with a red wavelength at the vicinity of 600 nm in red pixels became remarkably stronger in comparison with the comparative example 1 and the comparative example 2.

Figure 17:
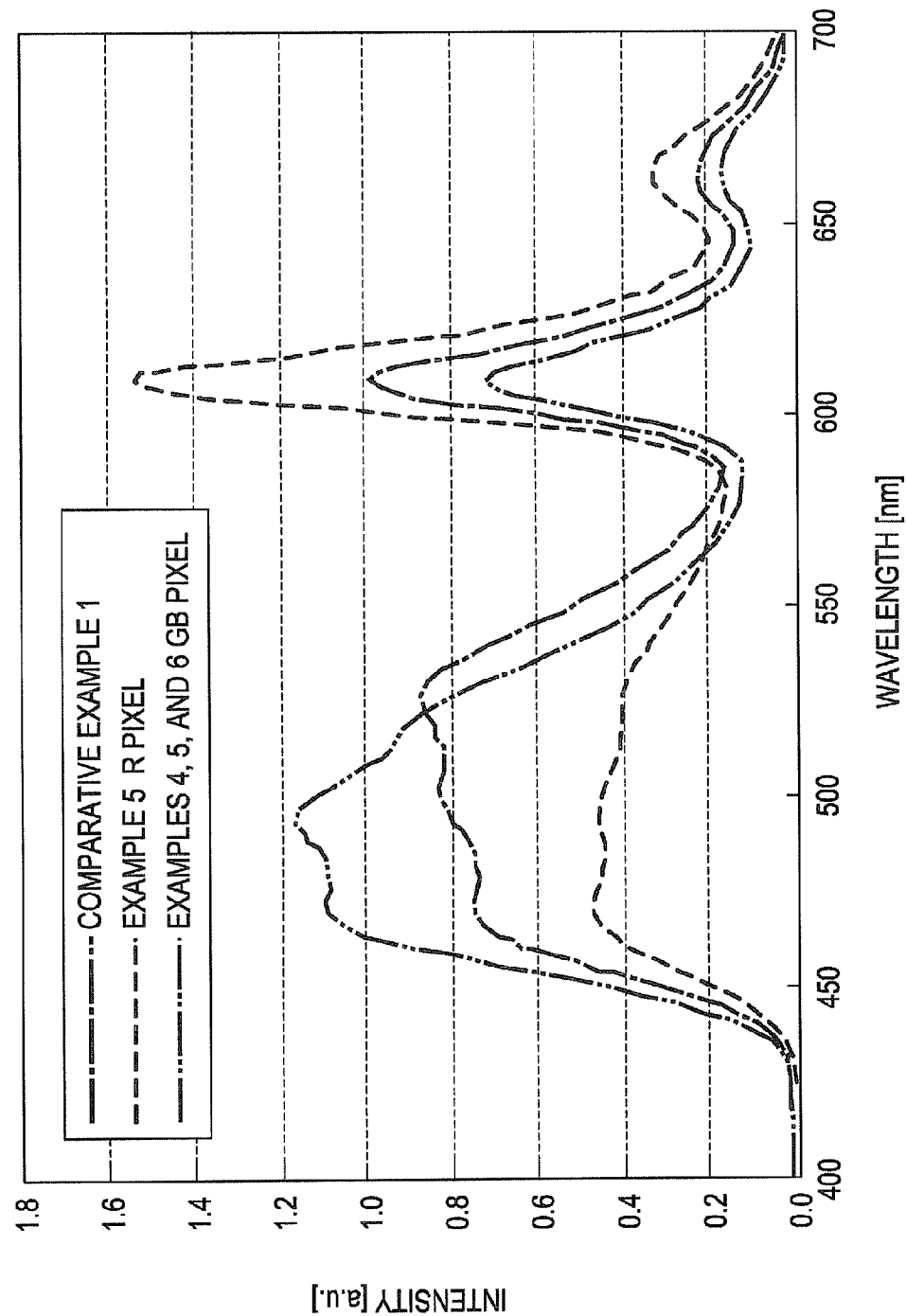
FIG. 17 is a diagram illustrating intensity of light in each pixel in comparative example 1, and example 4 or example 6.

In addition, as illustrated in FIG. 16, even in all examples of the example 4, the example 5, and the example 6, intensity of light in a green region (520 to 560 nm) and a blue region (450 to 470 nm) in green pixels and blue pixels was not changed in comparison with the comparative example 2. However, as illustrated in FIG. 17, in all examples of the example 4, the example 5, and the example 6, it has been found that intensity of light of the green region and the blue region in green pixels and blue pixels became remarkably stronger in comparison with the comparative example 1.

As described above, by setting the distance D between the reflecting layer and pixel electrode 12 and the counter electrode 30 as the semitransparent reflecting layer on the light extraction side so that a peak wavelength of a standing wave is 450 to 600 nm in the above equation (6), the extraction efficiency of green light and blue light in the green pixels and the blue pixels as well as the extraction efficiency of red light in the red pixels may be improved.

In general, there are many cases in which the power consumption is greatly affected by emission efficiency of the blue pixels. Accordingly, in the modified example, the emission efficiency of the blue pixels may be improved, thereby further reducing the power consumption.

Therefore, according to the modified example, in the light emitting device having the optical structure obtained when $m=0$ is satisfied in the above equation (6), extraction efficiency of green light and blue light as well as extraction efficiency of red light may be improved, thereby further reducing the power consumption.

Second Embodiment

Next, an embodiment of a manufacturing method of the light emitting device E1 of the invention will be described. In the present embodiment, a process of manufacturing the light emitting device using a material of the reflecting layer 12 of a red light emitting element, which is a material different from that of the pixel reflecting layers of other colors, will be described. As an example, an example in which the reflecting layer of the red light emitting element is made of Cu, and reflecting layers of a green light emitting element and a blue light emitting element are made of Al will be described.

Figure 18:
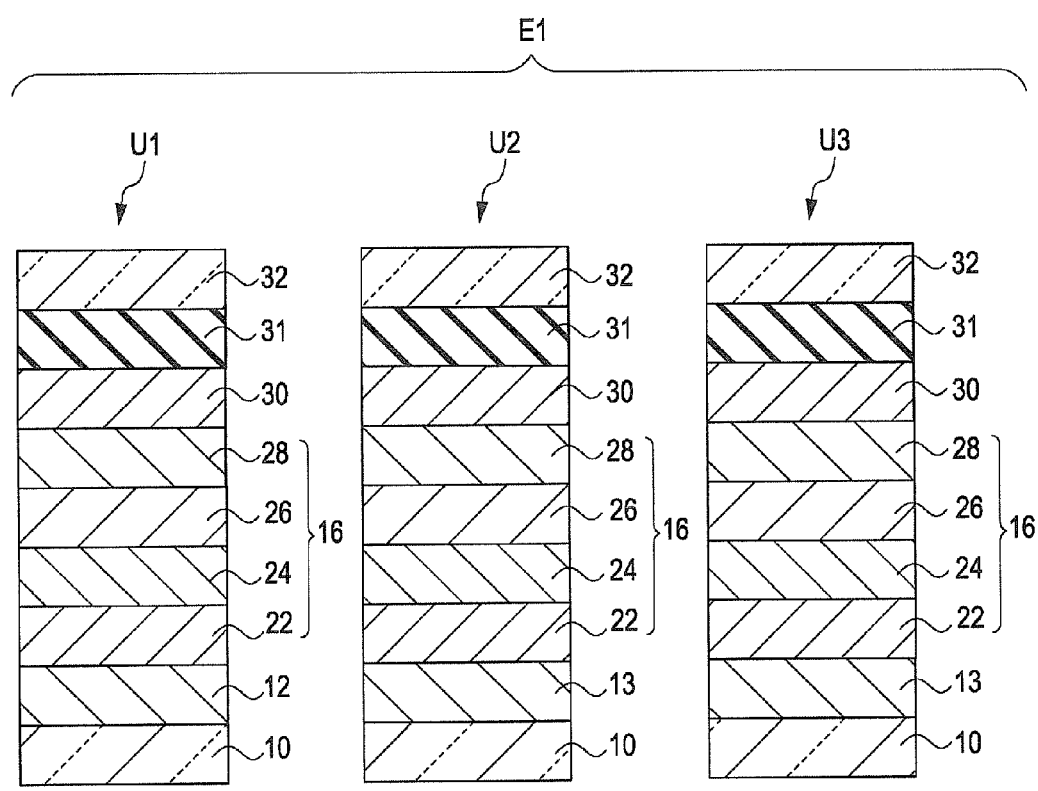
FIG. 18 is a schematic cross-sectional diagram illustrating an outline of a light emitting device according to a second embodiment of the invention.

As illustrated in FIG. 18, the light emitting device E1 of the present embodiment has a configuration in which the red light emitting element U1, the green light emitting element U2, and the blue light emitting element U3 are arranged on a surface of the first substrate 10, in the same manner as that of the light emitting element described in the first embodiment. A configuration of each layer is the same as that described in the first embodiment, and thus, is denoted by the same reference numerals.

First, on the first substrate 10 as illustrated in FIG. 19A, a circuit element thin film 11 and an interlayer insulating film 301 are formed. The interlayer insulating film 301 is made of $SiO_2$ or SiN. In all of the depositions of these, a deposition method such as a PVD method, a CVD method, a sputtering method, and the like, or a photolithography method which has been known may be appropriately used. At that time, the deposition of the circuit element thin film 11 includes manufacturing of TFT (Thin Film Transistor), so that a doping process or the like may be performed on the semiconductor layer, and a suitable etching process or the like may be performed in the deposition of the insulating film 301 in order to form a contact hole 360 on the semiconductor layer.

Next, as illustrated in FIG. 19B, an isolation film 302 is formed between pixels, and made of $SiO_2$ or SiN. In addition, it is preferable that the isolation film 302 be made of SiN when the above described insulating film 301 is made of $SiO_2$, and the isolation film 302 be made of $SiO_2$ when the insulating film 301 is SiN. Even in the deposition of the isolation film 302, a deposition method such as a PVD method, a CVD method, a sputtering method, and the like, or a photolithography method may be appropriately used.

Figure 20A:
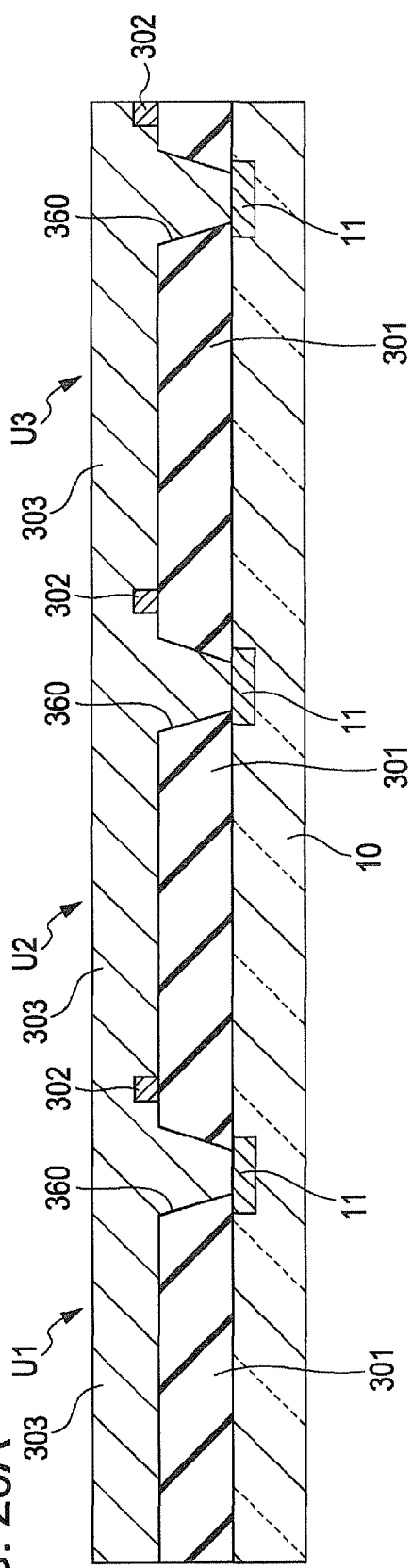
Figure 20B:
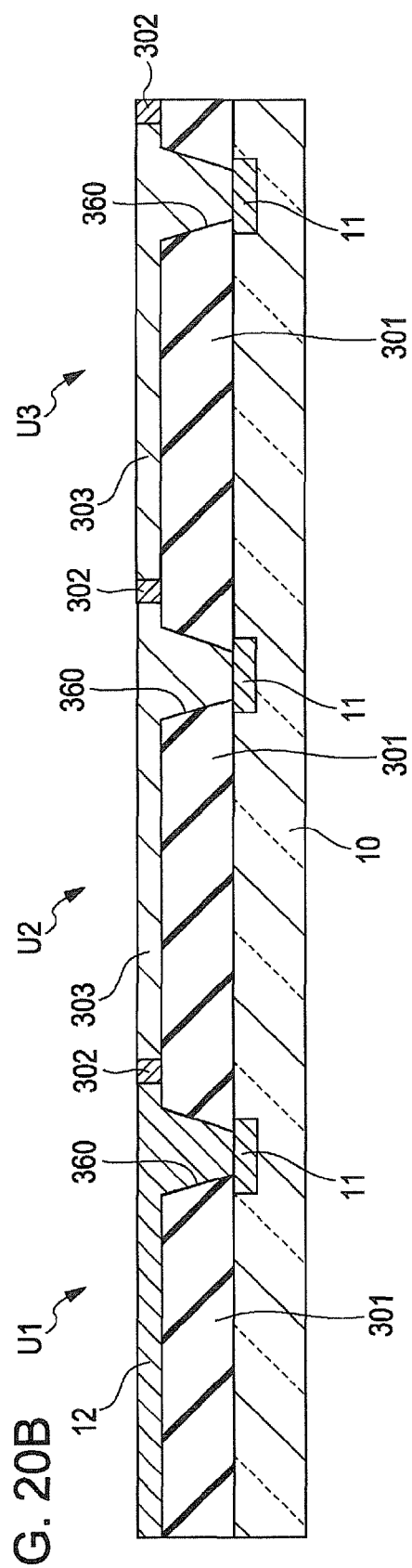

After forming the isolation film 302, as illustrated in FIG. 20A, an upper and lower conduction film 303 is formed by the sputtering method using Cu or a damascene method using electrolytic plating. As illustrated in FIG. 20B, the upper and lower conduction film 303 is flattened up to a position of the isolation film 302 by a CMP (Chemical Mechanical Polishing) method or the like.

In the red light emitting element U1, the upper and lower conduction film 303 may function as the reflecting layer and pixel electrode 12. In this manner, in the present embodiment, the reflecting layer and pixel electrode 12 of the red light emitting element, and the upper and lower conduction film 303 of the green light emitting element U2 and the blue light emitting element U3 may be formed by the same process.

Next, as illustrated in FIG. 21A, on the upper and lower conduction film 303 of the green light emitting element U2 and the blue light emitting element U3, Al is deposited by the sputtering method, is patterned by the photolithography method, wet etching, or dry etching, and is subjected to a resist peeling process to thereby form a reflecting layer 13.

The reflective film 13 of the green light emitting element U2 and the reflective film 13 of the blue light emitting element U3 are formed so as to be isolated on the isolation film 302 between the green light emitting element U2 and the blue light emitting element U3.

Subsequently, as illustrated in FIG. 21B, the isolation film 320 is formed between pixels. An external shape of the isolation film 320 is formed in a manner such that photosensitive polyimide is applied to the isolation film 320, and then the isolation film 320 is subjected to an exposure process and a development process. In addition, a cross-sectional shape of the isolation film 320 is formed as a tapered shape as illustrated in FIG. 21B. In addition, the isolation film 320 may be formed by performing a photolithography process and an etching process with respect to $SiO_2$ or SiN.

Next, as illustrated in FIG. 22A, an OLED layer 16 is formed by a vapor deposition method. In addition, as illustrated in FIG. 22B, MgAg is deposited by the vapor deposition method to thereby form the counter electrode 30.

Figure 23:
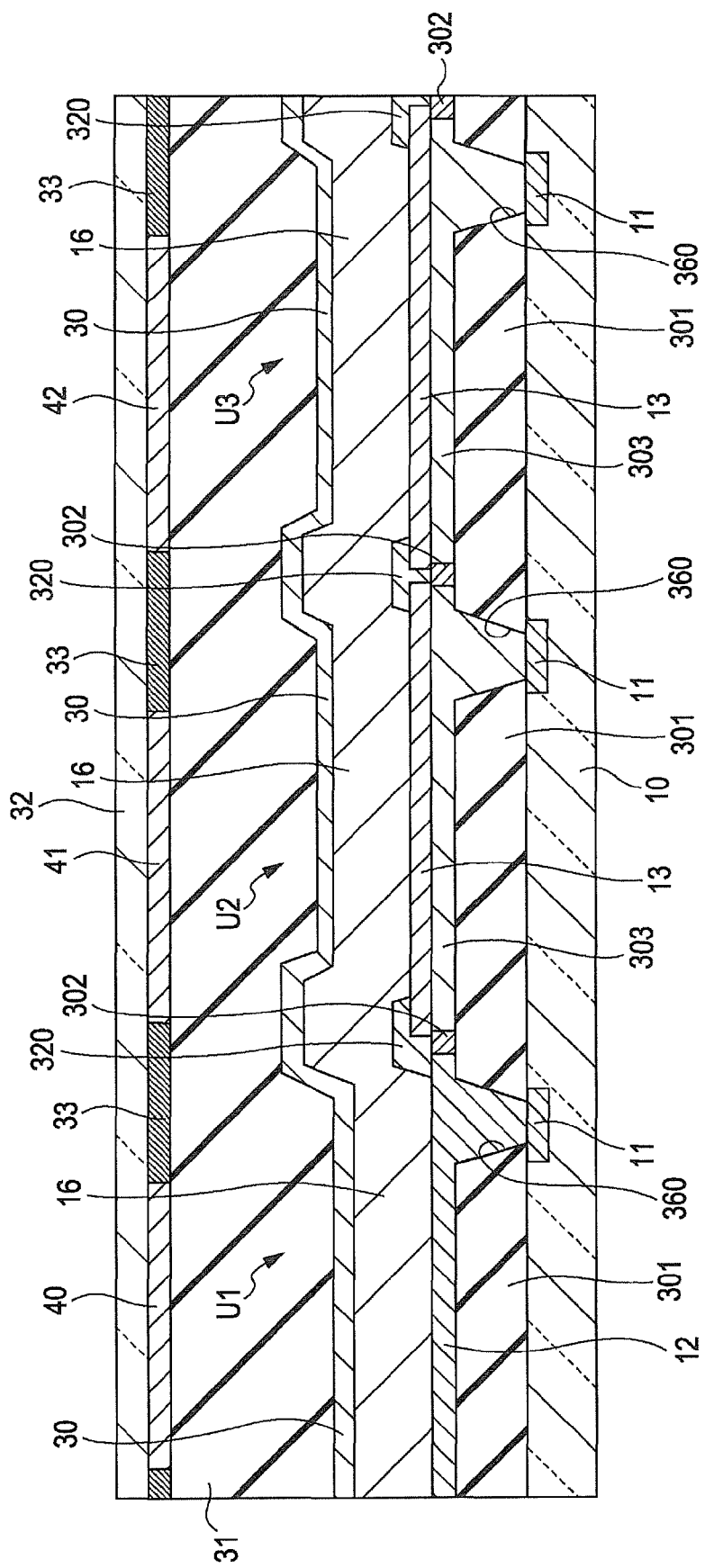
FIG. 23 is a process diagram for explaining the manufacturing method of the light emitting device of the embodiment, and illustrating a state in which a passivation layer is formed.

In addition, as illustrated in FIG. 23, SiN is deposited by the CVD method to thereby form the passivation layer 31. In addition, red, green, and blue color filters 40, 41, and 42 and a light shielding film 33 are formed by photolithography. Next, the second substrate 32 is bonded. The above is the manufacturing method of the light emitting device E1 of the present embodiment.

As described above, according to the manufacturing method of the present embodiment, the reflecting layer and pixel electrode 12 of the red light emitting element, and the upper and lower conduction film 303 of the green light emitting element U2 and the blue light emitting element U3 may be formed by the same process, and therefore it is possible to reduce the number of manufacturing processes than that of the related art.

In addition, Cu used as the reflecting layer and pixel electrode 12 of the red light emitting element U1 is a material frequently used as a wiring material in a semiconductor manufacturing line in which a process rule such as LSI or the like is 100 nm or less. Due to this, techniques that have been used in the semiconductor manufacturing line such as a formation technique, a flattening technique, and the like may be used, which is advantageous for the manufacturing process.

In addition, when the reflecting layer of Al is formed on the upper and lower conduction layer of Cu of the green light emitting element U2 and the blue light emitting element U3, patterning may be performed using the dry etching, the wet etching, or the like where a selection ratio of Cu and Al is high. In addition, when surface reflectance of Al is reduced by alloying of Cu and Al interface, a diffusion prevention layer (Ti, TiN, W, Ta, Mo, or the like) may be formed between Cu and Al.

In addition, in the above described embodiments, the case in which the reflecting layer and pixel electrode of the red light emitting element U1 is made of Cu, Au, Ag, or a metal material which is mainly composed of Cu, Au, and Ag, and the reflecting layer and pixel electrode of the green light emitting element U2 and the blue light emitting element U3 is made of Al has been described; however, the invention is not limited thereto. For example, the reflecting layer and pixel electrode of the red light emitting element U1 and the green light emitting element U2 may be made of Cu, Au, Ag, or a metal material which is mainly composed of Cu, Au, and Ag, and the reflecting layer and pixel electrode of the blue light emitting element U3 may be made of Al. In addition, in the above described embodiments, the case in which the integer m is 0 in the above equation (6) has been described; however, the invention is not limited thereto. A case in which the integer m is 1 or 2 may be applicable.

In addition, in the above described embodiments, examples in which Cu, Au, and Ag are used as the reflecting layer and pixel electrode of the red pixels have been described; however, the invention is not limited thereto, as the red pixel reflecting layer and pixel electrode, an alloy which is mainly composed of at least one of Cu, Au, and Ag may be used, or an alloy containing, for example, Cu, Mg, and Ca or an alloy containing Au and Cu may be used.

In addition, in the above described embodiments, Au is used as a material of an upper and lower conduction layer, and the upper and lower conduction layer may be formed by combining a plating method (sputtering method or vapor deposition method) and a CMP method.

In addition, Al (for the blue light emitting element and the green light emitting element) is used as a material of the upper and lower conduction layer and the reflecting layer, and the upper and lower conduction layer and the reflecting layer may be formed by combining the sputtering method and the CMP method. In this case, Ag, Cu, and Au are formed in a post-process as used for the red light emitting element. In addition, when Ag is used, a three-layer-structure of ITO/Ag/ITO may be preferable. In addition, when ITO and Al are used, prevention electrolytic corrosion of ITO and Al may be carried out using Ti, TiN, W, Ta, Mo, or an alloy which is composed of Ti, TiN, W, Ta, or Mo.

Third Embodiment

Figure 24:
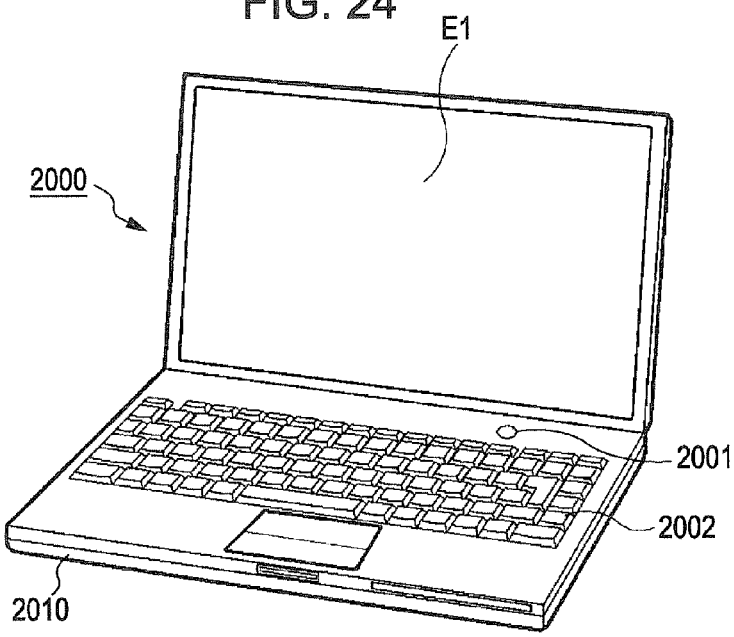
FIG. 24 is a diagram illustrating an electronic apparatus according to a third embodiment of the invention, and a perspective diagram illustrating a configuration of a mobile personal computer of which the light emitting device according to the embodiment of FIG. 1 is adopted as a display device.

Next, an electronic apparatus using the light emitting device according to the invention will be described. FIG. 24 is a perspective diagram illustrating a configuration of a mobile personal computer of which the light emitting device E1 according to the above described embodiments is adopted as a display device. A personal computer 2000 includes the light emitting device E1 as the display device, and a main body 2010. In the main body 2010, a power switch 2001 and a keyboard 2002 are provided. The light emitting device E1 uses the organic EL element, and therefore it is possible to display a screen which has a wide viewing angle and is easy to see.

Figure 25:
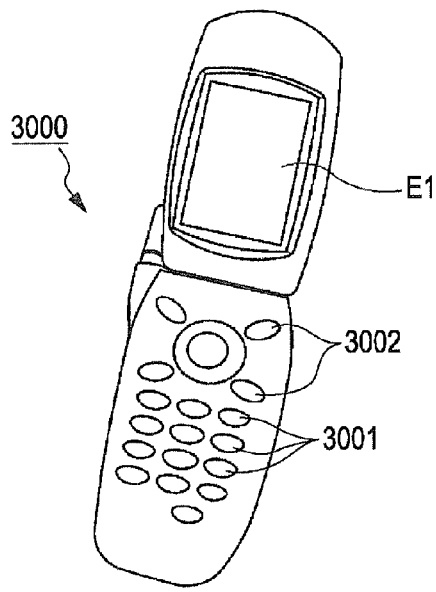
FIG. 25 is a diagram illustrating an electronic apparatus according to a third embodiment of the invention, and a perspective diagram illustrating a configuration of a mobile telephone set in which the light emitting device according to the embodiment of FIG. 1 is adopted as a display device.

In FIG. 25, a configuration of a mobile telephone set to which the light emitting device E1 according to the above described embodiments is applied is illustrated. The mobile telephone set 3000 includes a plurality of operational buttons 3001, a scroll button 3002, and the light emitting device E1 as the display device. By operating the scroll button 3002, a screen displayed on the light emitting device E1 is scrolled.

Figure 26:
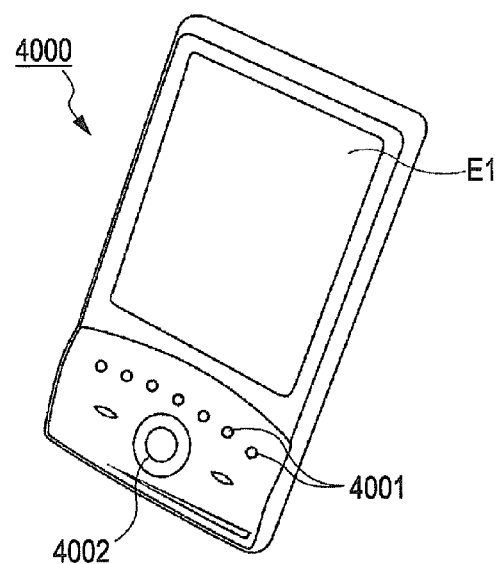
FIG. 26 is a diagram illustrating an electronic apparatus according to a third embodiment of the invention, and a perspective diagram illustrating a configuration of a mobile information terminal in which the light emitting device according to the invention of FIG. 1 is adopted as a display device.

In FIG. 26, a configuration of a mobile information terminal (PDA: Personal Digital Assistant) to which the light emitting device E1 according to the above described embodiments is applied is illustrated. A mobile information terminal 4000 includes a plurality of operational buttons 4001, a power switch 4002, and the light emitting device E1 as the display device. When the power switch 4002 is operated, a variety of information such as an address book and a diary may be displayed on the light emitting device E1.

In addition, as the electronic apparatus to which the light emitting device is applied, beyond the apparatuses illustrated in FIGS. 24 to 26, apparatuses and the like including digital still cameras, televisions, video cameras, car navigation systems, pagers, electronic organizers, electronic papers, calculators, word processors, workstations, video phones, POS terminals, printers, scanners, copiers, video players, touch panels, or the like may be given.

In addition, in the above described embodiments, the case in which the integer m is 0 in the above equation (4) has been described; however, the invention is not limited thereto. A case in which the integer m is 1 or 2 may be applicable.

In addition, in the above described embodiments, an example in which Cu, Au, and Ag are used as the red pixel reflecting layer and pixel electrode has been described; however, the invention is not limited thereto. As the red pixel reflecting layer and pixel electrode, an alloy which is mainly composed of at least one of Cu, Au, and Ag may be used, or an alloy containing, for example, Cu, Mg, and Ca or an alloy containing Au and Cu may be used.

In addition, the color filter may be directly formed on a sealing layer using the photolithography method.

The entire disclosure of Japanese Patent Application No. 2011-119675, filed May 27, 2011 and Japanese Patent Application No. 2011-123401, filed Jun. 1, 2011 are expressly incorporated by reference herein.

What is claimed is:

1. A light emitting device, comprising:
   a substrate;
   a light reflecting layer that is formed on or above the substrate;
   a light emitting layer that is formed on or above the light reflecting layer; and
   an electrode that is formed on or above the light emitting layer,
   wherein, an optical path length in a resonance structure between the light reflecting layer and the electrode is adjusted,
   $D=\{(2\pi m+\phi_L+\phi_U)/4\pi\}\lambda$ is satisfied when the optical path length between the light reflecting layer and the electrode is D, a phase shift in reflection by the light reflecting layer is $\phi_L$, a phase shift in reflection by the electrode is $\phi_U$, a peak wavelength of a standing wave generated between the light reflecting layer and the electrode is $\lambda$, and an integer of 2 or less is m, and
   the light reflecting layer is provided for each red, green, and blue pixels, and among the red pixel, green pixel and blue pixel light reflecting layers, at least one is made of a different metal material from the metal material used in the other light reflecting layers.

2. The light emitting device according to claim 1,
   wherein, when a phase shift amount is $\phi$, a refractive index of the light emitting layer is $n_1$, a refractive index of the reflecting layer is $n_2$, and an extinction coefficient of the reflecting layer is $k_2$, $\phi=\tan^{-1}\{2n_1 k_2/(n_1^2-n_2^2-k_2^2)\}$ is satisfied, and the pixel reflecting layer of a color with a longer wavelength than that of the pixels of the other colors is made of a metal material having a smaller phase shift amount $\phi$ than that of the pixel reflecting layer of the other colors.

3. An electronic apparatus including the light emitting device described in claim 2.

4. The light emitting device according to claim 1,
   wherein a value of the integer m is 0.

5. An electronic apparatus including the light emitting device described in claim 4.

6. The light emitting device according to claim 1,
   wherein the green and blue pixel reflecting layers or the red and green pixel reflecting layers are made of the same metal material.

7. An electronic apparatus including the light emitting device described in claim 6.

8. The light emitting device according to claim 1,
   wherein the red or green reflecting layer is made of Cu, Au, or Ag, or a metal material which is mainly composed of at least one of Cu, Au, and Ag.

9. An electronic apparatus including the light emitting device described in claim 8.

10. The light emitting device according to claim 1,
    wherein a color filter is provided on an upper layer of the electrode.

11. An electronic apparatus including the light emitting device described in claim 10.

12. An electronic apparatus including the light emitting device described in claim 1.

13. A manufacturing method of a light emitting device, comprising:
    forming a circuit element thin film on or above a substrate;
    forming a reflecting layer and pixel electrode on or above the substrate;
    forming a light emitting layer on or above the reflecting layer and pixel electrode; and
    forming a counter electrode on or above the light emitting layer,
    wherein, an optical path length D is set so that $D=\{(2\pi m+\phi_L+\phi_U)/4\pi\}\lambda$ is satisfied when an optical path length between the reflecting layer and pixel electrode and the counter electrode is D, a phase shift in reflection on the reflecting layer and pixel electrode is $\phi_L$, a phase shift in reflection on the counter electrode is $\phi_U$, a peak wavelength of a standing wave generated between the reflecting layer and pixel electrode and the counter electrode is $\lambda$, and an integer of 2 or less is m,
    and wherein the forming of the reflecting layer and pixel electrode is forming the reflecting layer and pixel electrode so as to be brought into direct contact with the circuit element thin film with respect to pixels of at least one color, the forming of the reflecting layer and pixel electrode further includes forming upper and lower conduction layers so as to be brought into direct contact with the circuit element thin film with respect to pixels of the other colors, the forming of the reflecting layer and pixel electrode with respect to the pixels of the other colors is forming the reflecting layer and pixel electrode on the upper and lower conduction layers, the forming of the reflecting layer and pixel electrode with respect to the pixels of at least one color and the forming of the upper and lower conduction layers with respect to the pixels of the other colors are the same, and the forming of the reflecting layer and pixel electrode with respect to the pixels of at least one color is forming the reflecting layer and pixel electrode using a metal material different from a metal material which is used in the forming of the reflecting layer and pixel electrode with respect to the pixels of the other colors.

14. The manufacturing method of the light emitting device according to claim 13, wherein the forming of the reflecting layer and pixel electrode with respect to the pixels of at least one color is forming the reflecting layer and pixel electrode in pixels of a color having a longer wavelength than that of the pixels of the other colors, using a metal material having a smaller phase shift amount φ than that of the reflecting layer and pixel electrode in the pixels of the other colors, so that $\phi=\tan^{-1}\{2n_1 k_2/(n_1^2-n_2^2-k_2^2)\}$ is satisfied when a phase shift amount is φ, a refractive index of the light emitting layer is $n_1$, a refractive index of the reflecting layer and pixel electrode is $n_2$, and an extinction coefficient of the reflecting layer and pixel electrode is $k_2$.

15. The manufacturing method of the light emitting device according to claim 13, wherein the pixels of at least one color are red pixels, or the red pixels and green pixels.

16. The manufacturing method of the light emitting device according to claim 13, wherein the forming of the reflecting layer and pixel electrode with respect to the pixels of at least one color is forming the reflecting layer and pixel electrode using Cu, Au, and Ag or a metal material which is mainly composed of Cu, Au, and Ag with respect to red pixels or the red pixels and green pixels.

17. The manufacturing method of the light emitting device according to claim 13, wherein the forming of the reflecting layer and pixel electrode with respect to the pixels of at least one color and the forming of the upper and lower conduction layers with respect to the pixels of the other colors are forming the reflecting layer and pixel electrode and the upper and lower conduction layers by a Damascene method.

18. The manufacturing method of the light emitting device according to claim 13, further comprising:
   forming a diffusion prevention layer between the upper and lower conduction layers and the reflecting layer and pixel electrode with respect to the pixels of the other colors.

19. The manufacturing method of the light emitting device according to claim 18, wherein the forming of the diffusion prevention layer is forming the diffusion prevention layer using Ti, TiN, W, Ta, Mo or an alloy which is mainly composed of Ti, TiN, W, Ta, and Mo.

20. The manufacturing method of the light emitting device according to claim 13, further comprising:
   forming a color filter on the counter electrode.

* * * * *